(12) United States Patent
Ishida et al.

(10) Patent No.: US 9,788,426 B2
(45) Date of Patent: Oct. 10, 2017

(54) PRINTED WIRING BOARD

(71) Applicants: FUJIKURA LTD., Tokyo (JP); DDK Ltd., Tokyo (JP)

(72) Inventors: Yuki Ishida, Kohtoh-ku (JP); Masayuki Suzuki, Kohtoh-ku (JP); Harunori Urai, Kohtoh-ku (JP)

(73) Assignees: FUJIKURA LTD., Tokyo (JP); DDK Ltd., Tokyo (JP)

( * ) Notice: Subject to any disclaimer, the term of this patent is extended or adjusted under 35 U.S.C. 154(b) by 0 days.

(21) Appl. No.: 15/327,476

(22) PCT Filed: Jul. 10, 2015

(86) PCT No.: PCT/JP2015/069956
§ 371 (c)(1),
(2) Date: Jan. 19, 2017

(87) PCT Pub. No.: WO2016/013431
PCT Pub. Date: Jan. 28, 2016

(65) Prior Publication Data
US 2017/0181282 A1 Jun. 22, 2017

(30) Foreign Application Priority Data
Jul. 22, 2014 (JP) ................. 2014-148767

(51) Int. Cl.
*H05K 1/11* (2006.01)
*H05K 1/14* (2006.01)
*H01R 12/77* (2011.01)

(52) U.S. Cl.
CPC ............. *H05K 1/115* (2013.01); *H01R 12/77* (2013.01); *H05K 1/111* (2013.01); *H05K 1/144* (2013.01); *H05K 2201/041* (2013.01)

(58) Field of Classification Search
CPC ........ H05K 1/112; H05K 1/113; H05K 1/114; H05K 1/115; H05K 1/116
See application file for complete search history.

(56) References Cited

U.S. PATENT DOCUMENTS

| 6,089,905 A | 7/2000 | Shimmyo et al. |
| 8,302,301 B2 | 11/2012 | Lau |
| 2007/0197104 A1 | 8/2007 | Nagawatari |

FOREIGN PATENT DOCUMENTS

| CN | 101044805 A | 9/2007 |
| EP | 1 109 258 A2 | 6/2001 |

(Continued)

OTHER PUBLICATIONS

Communication dated Dec. 27, 2016, issued by the Intellectual Property Office of Taiwan in counterpart Application No. 104123048.

(Continued)

*Primary Examiner* — Jeremy C Norris
(74) *Attorney, Agent, or Firm* — Sughrue Mion, PLLC

(57) ABSTRACT

A printed wiring board including: a first substrate on which a plurality of pads to be connected to a connector is arranged to form a front array and a rear array in two rows; a second substrate that is laminated on the first substrate and formed with first wirings connected to first pads of the front array and second wirings connected through vias to second pads of the rear array; engageable parts that are to be engaged with engagement parts of the connector; and one or more reinforcement layers that are provided at the frontward side in the connecting direction than the engageable parts of the first substrate and/or the second substrate. The wirings each have a part formed to have a constant width along the inserting direction to the connector and an expanded-width (Continued)

part expanded to have a wider width than the constant width in the inserting direction of the connector.

11 Claims, 31 Drawing Sheets

(56) References Cited

FOREIGN PATENT DOCUMENTS

| JP | 58-152786 U1 | 10/1983 |
|---|---|---|
| JP | 62-26882 U1 | 2/1987 |
| JP | 62-109475 U1 | 7/1987 |
| JP | 64-16083 U1 | 1/1989 |
| JP | 1-260884 A | 10/1989 |
| JP | 3-61366 U1 | 6/1991 |
| JP | 2000-30784 A | 1/2000 |
| JP | 2001-177206 A | 6/2001 |
| JP | 2002-56931 A | 2/2002 |
| JP | 2002-134860 A | 5/2002 |
| JP | 2006-196423 A | 7/2006 |
| JP | 2006-228988 A | 8/2006 |
| JP | 2007-227036 A | 9/2007 |
| JP | 2008-91363 A | 4/2008 |
| JP | 2008-117972 A | 5/2008 |
| JP | 2013-26601 A | 2/2013 |
| TW | 487272 U | 5/2002 |
| TW | 499823 B | 8/2002 |
| TW | M400686 U1 | 3/2011 |
| TW | M406826 U1 | 7/2011 |
| TW | M437518 U1 | 9/2012 |
| WO | 2006/101134 A1 | 9/2006 |

OTHER PUBLICATIONS

Notification of Reasons for Refusal for Japanese Patent Application No. 2014-148767, dated Mar. 4, 2015.
Notification of Reasons for Refusal for Japanese Patent Application No. 2014-148767, dated Jun. 19, 2015.
International Search Report of PCT/JP2015/069956, dated Sep. 15, 2015. [PCT/ISA/210].

FIG. 3
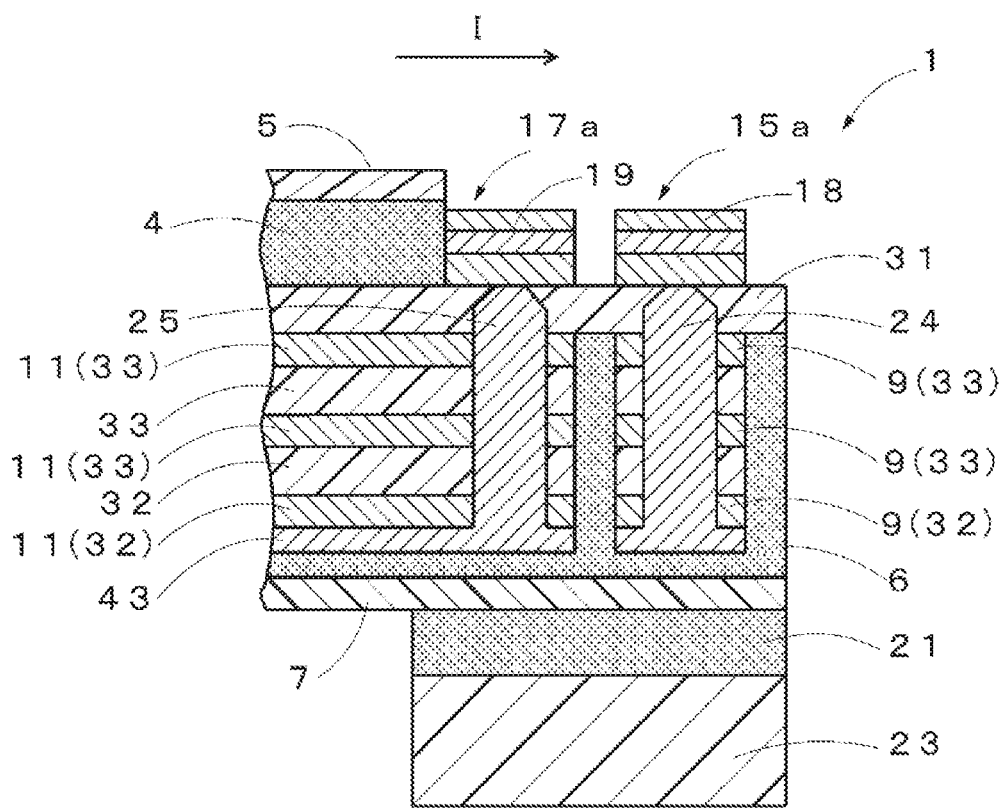
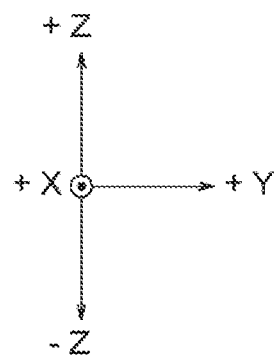

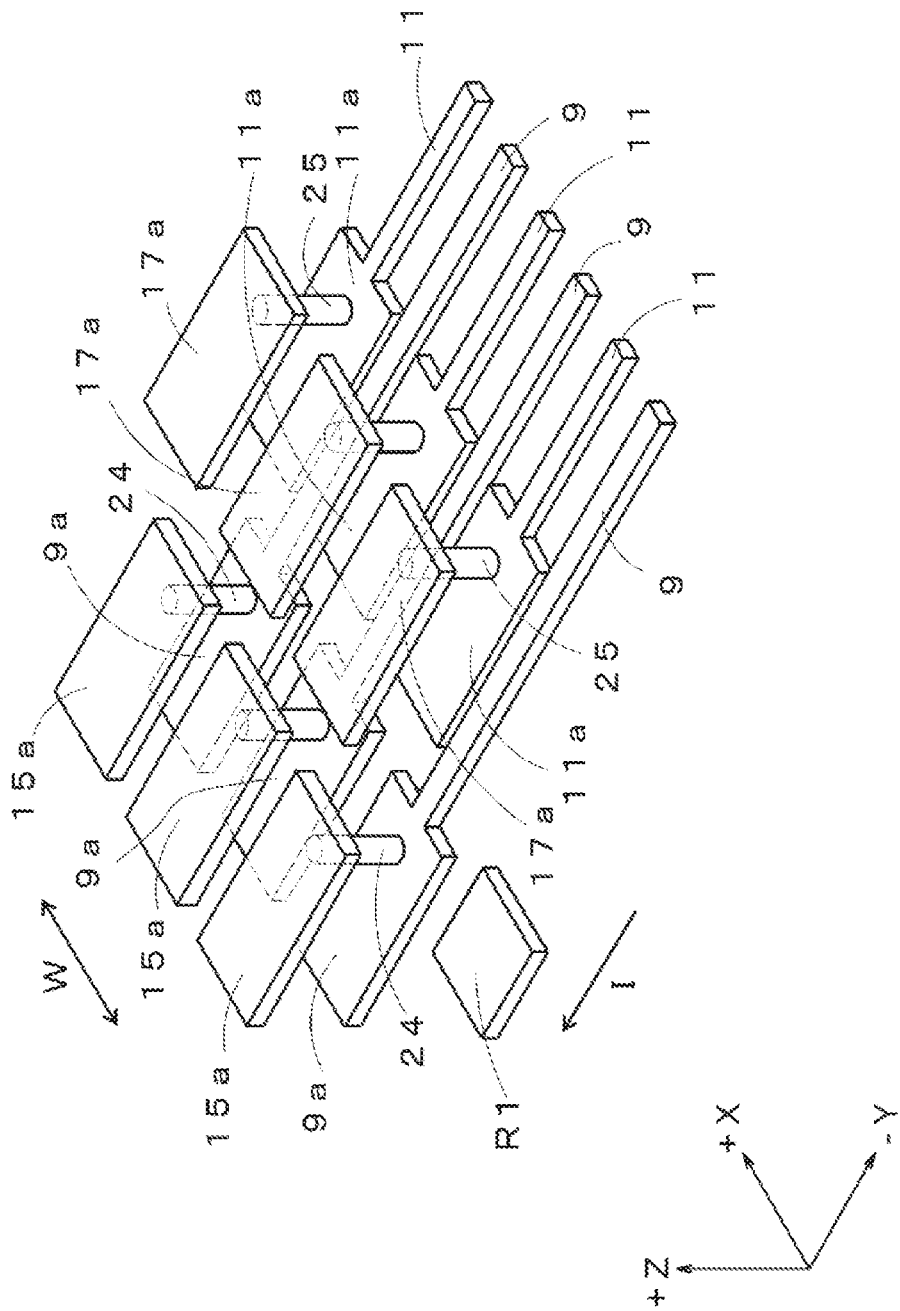

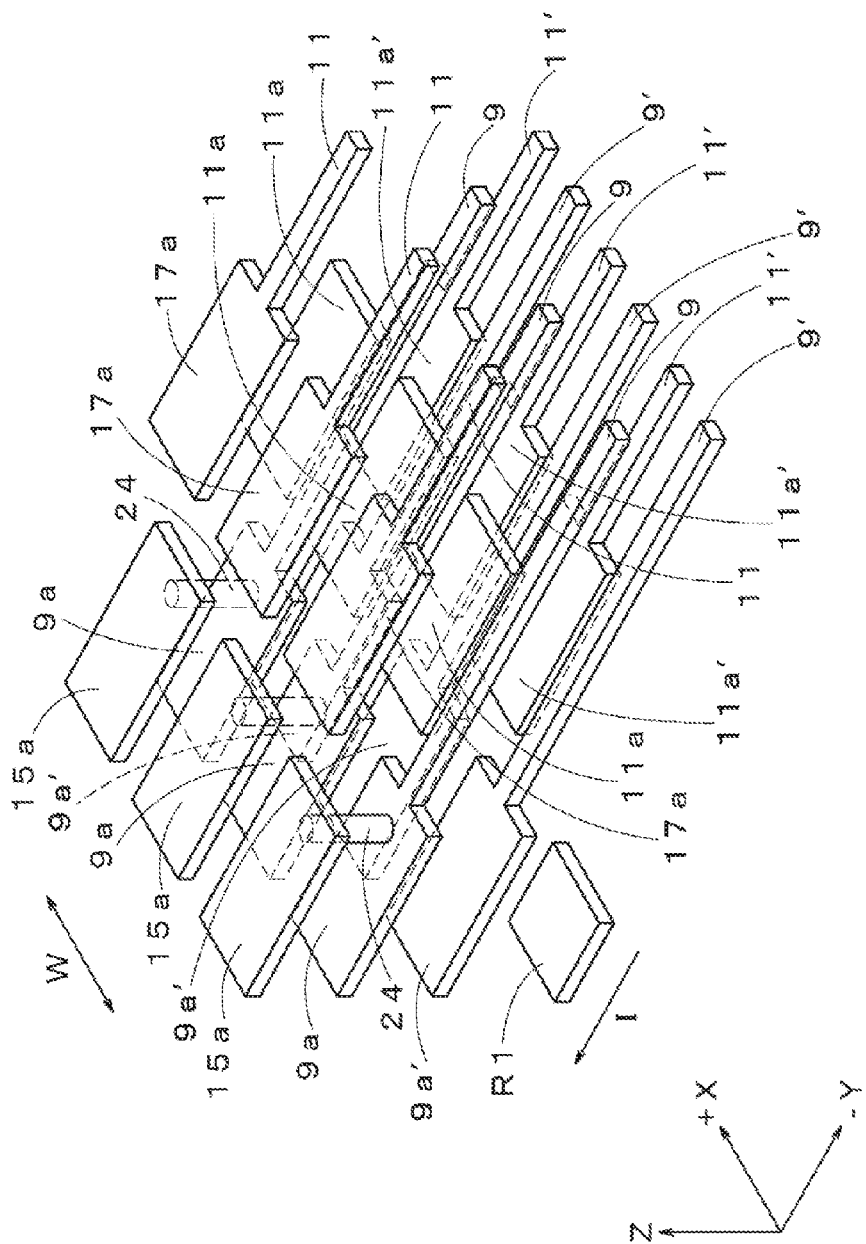

FIG. 6
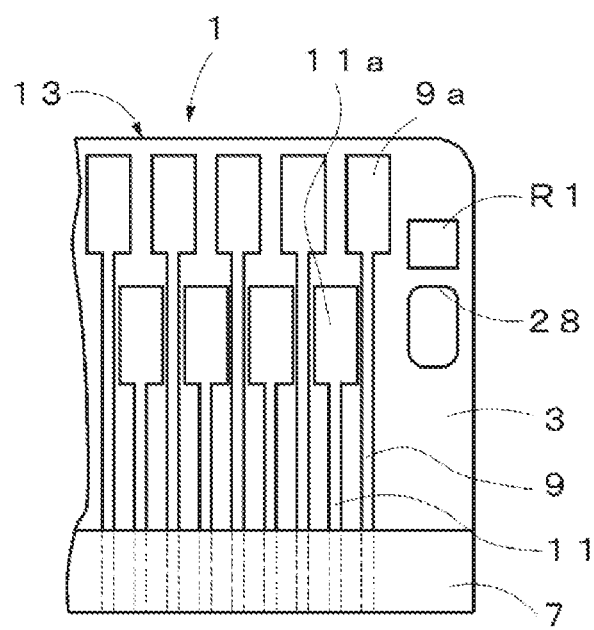
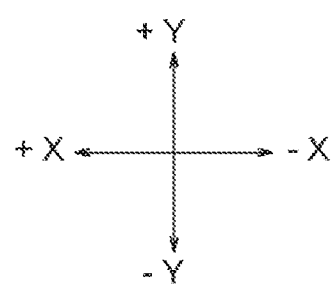

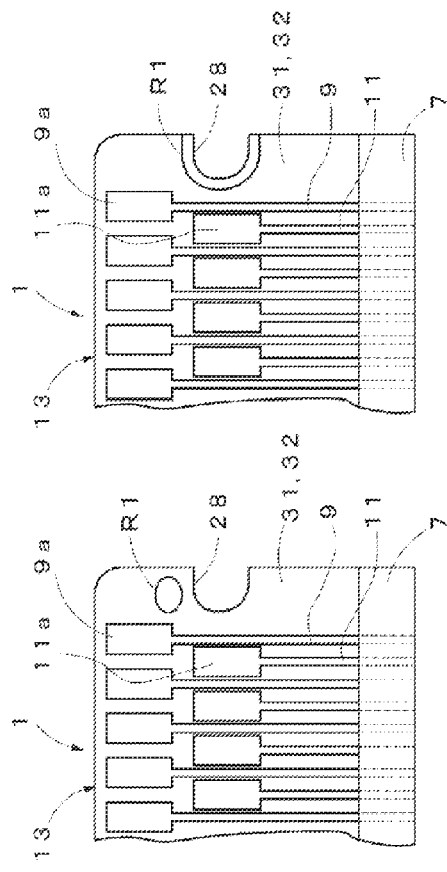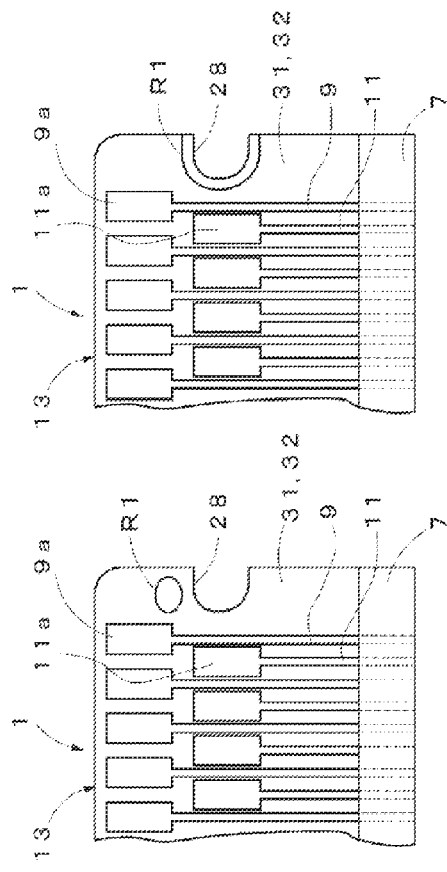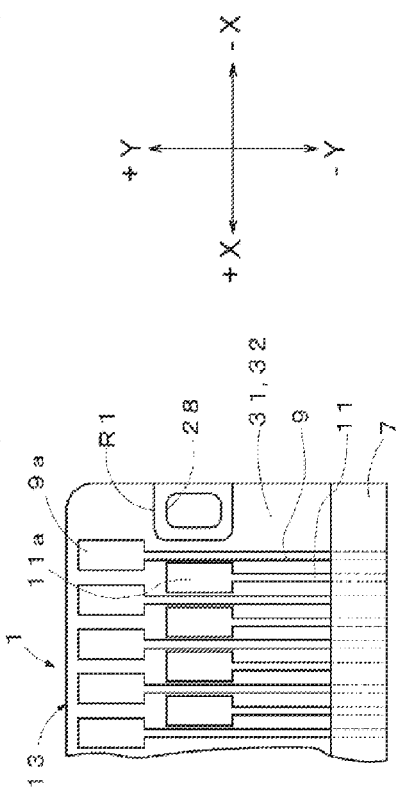

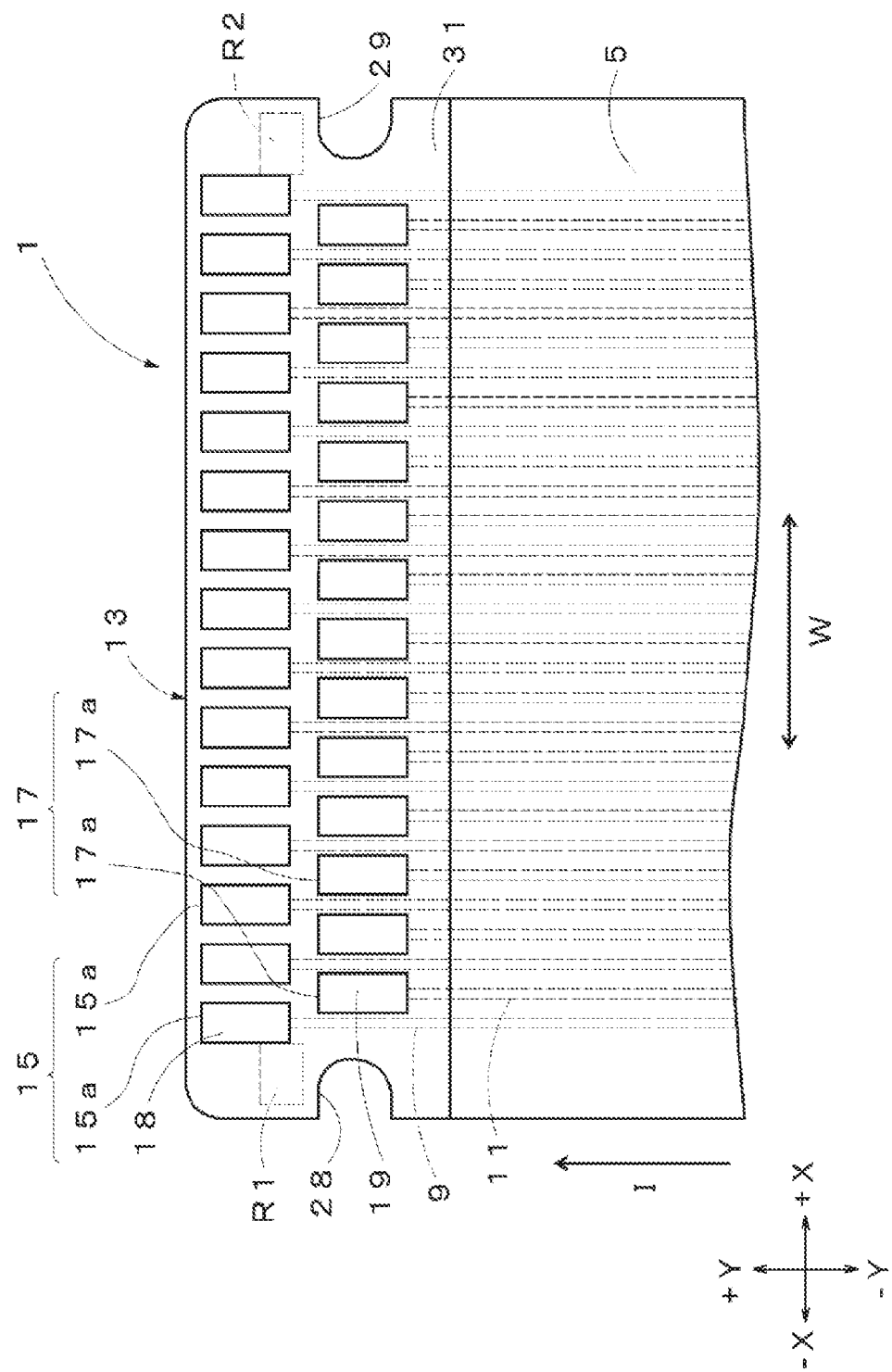

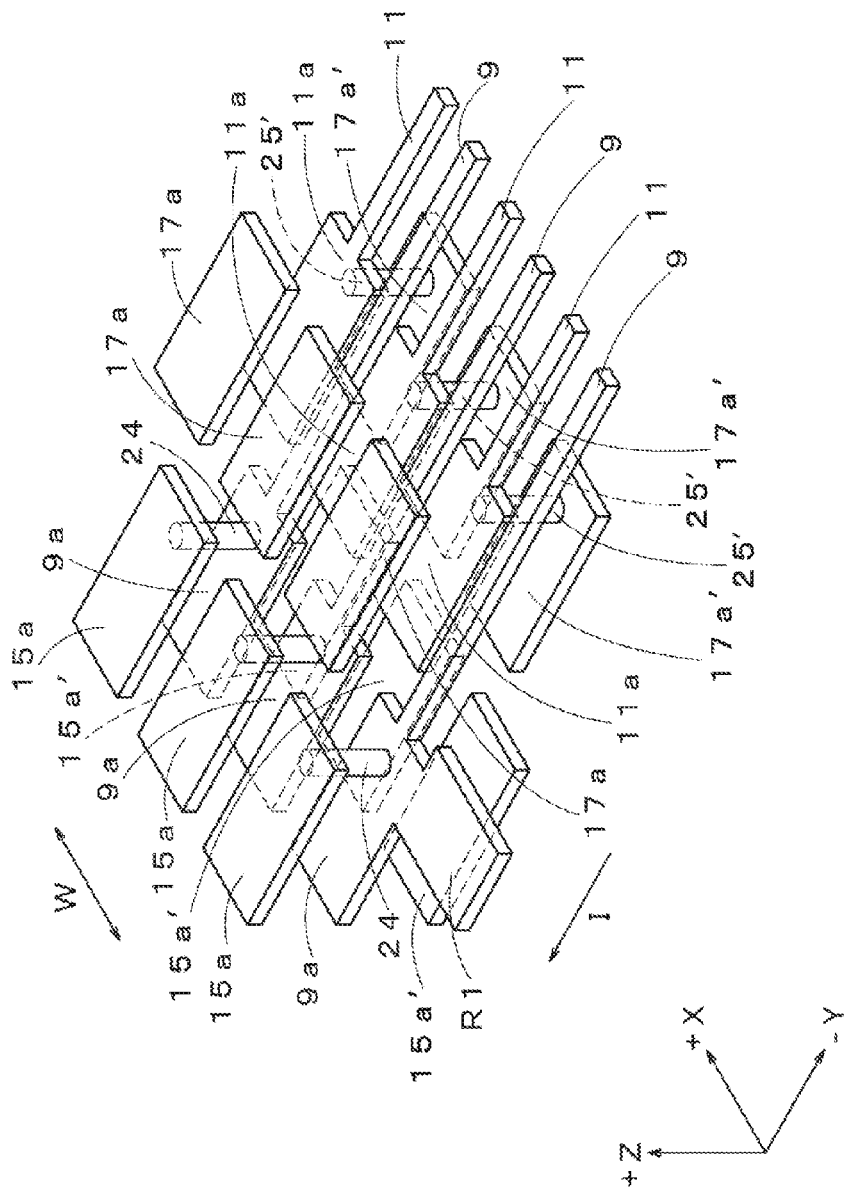

FIG.11
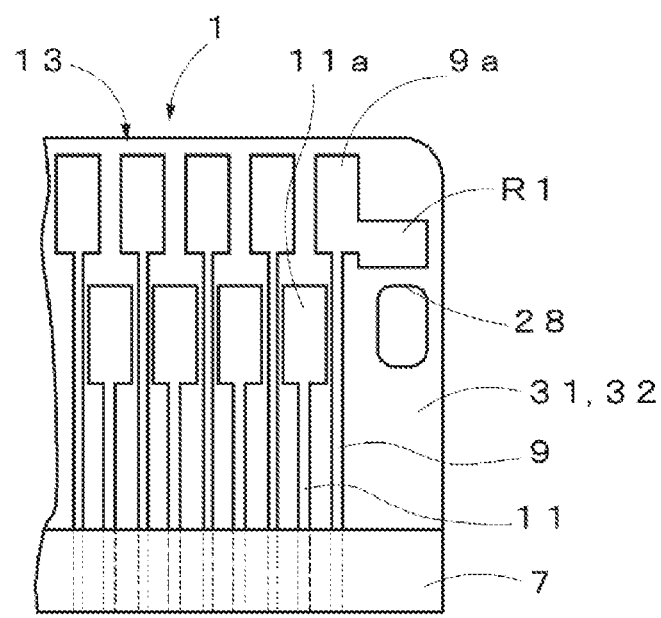
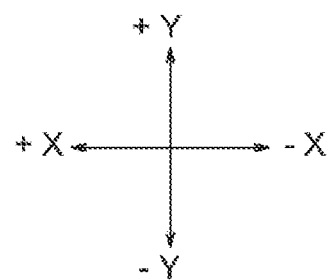

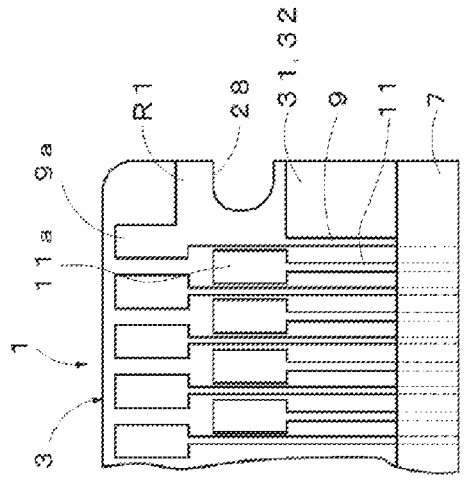
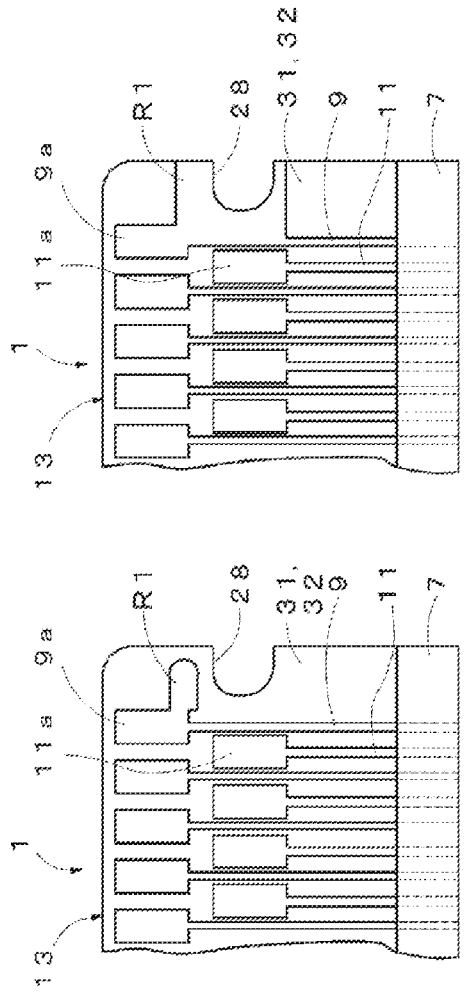
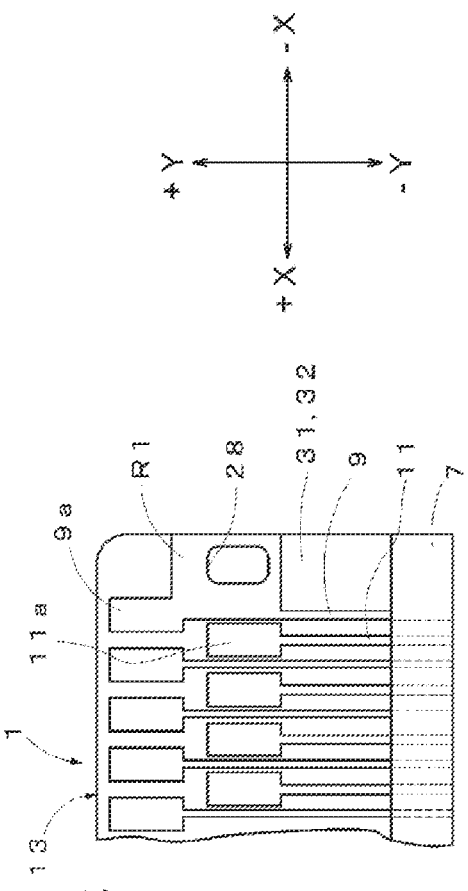

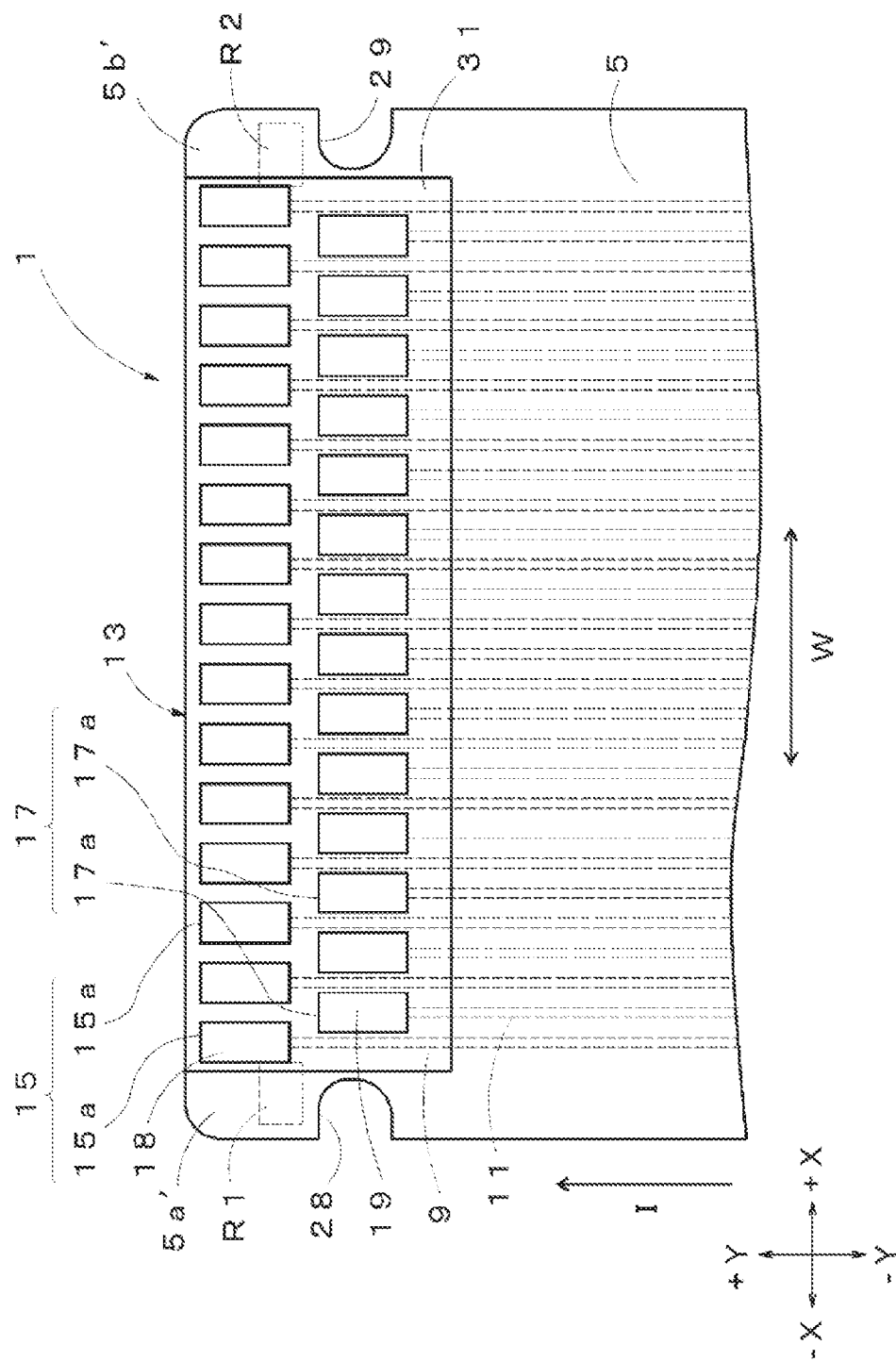

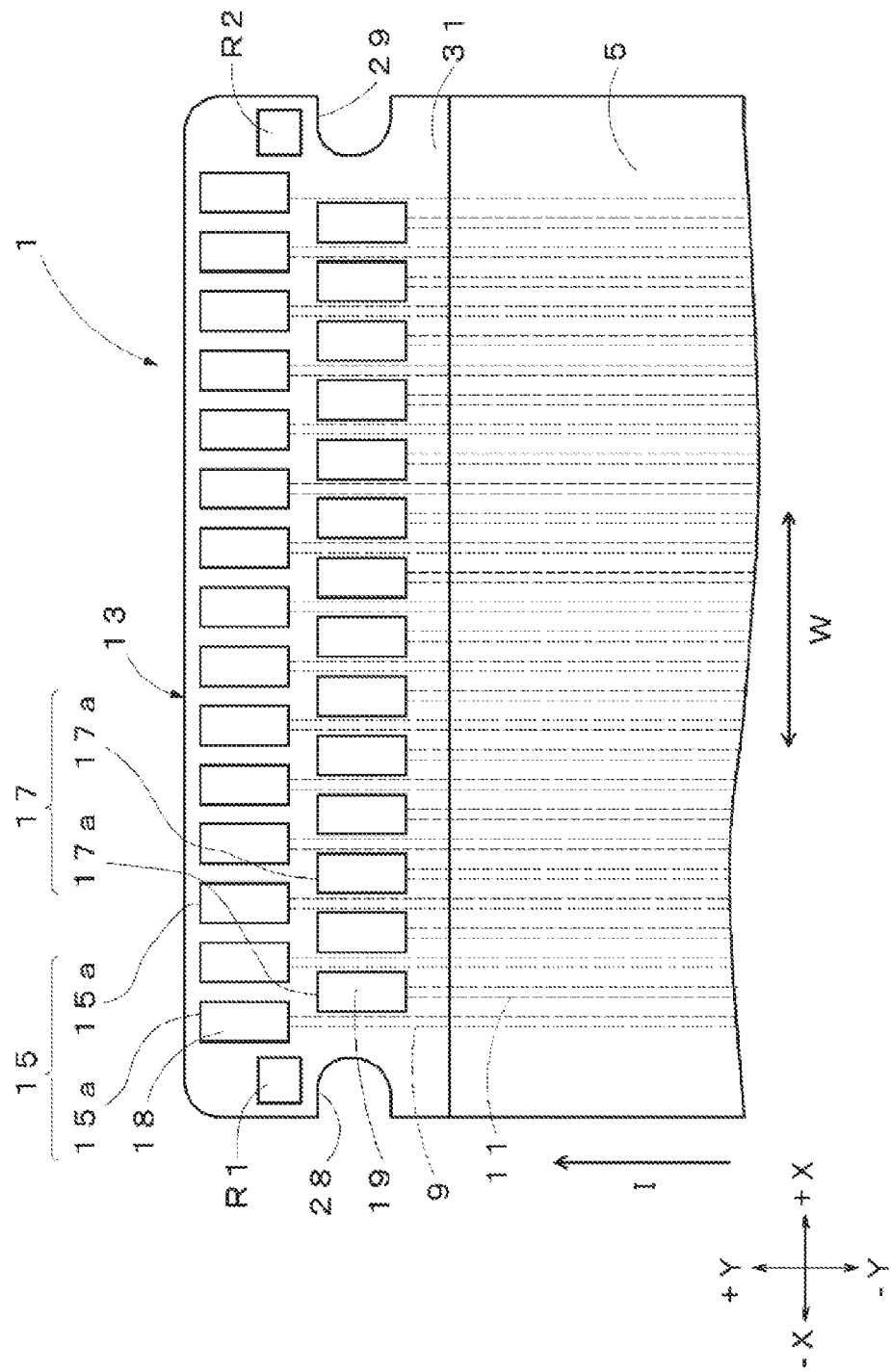

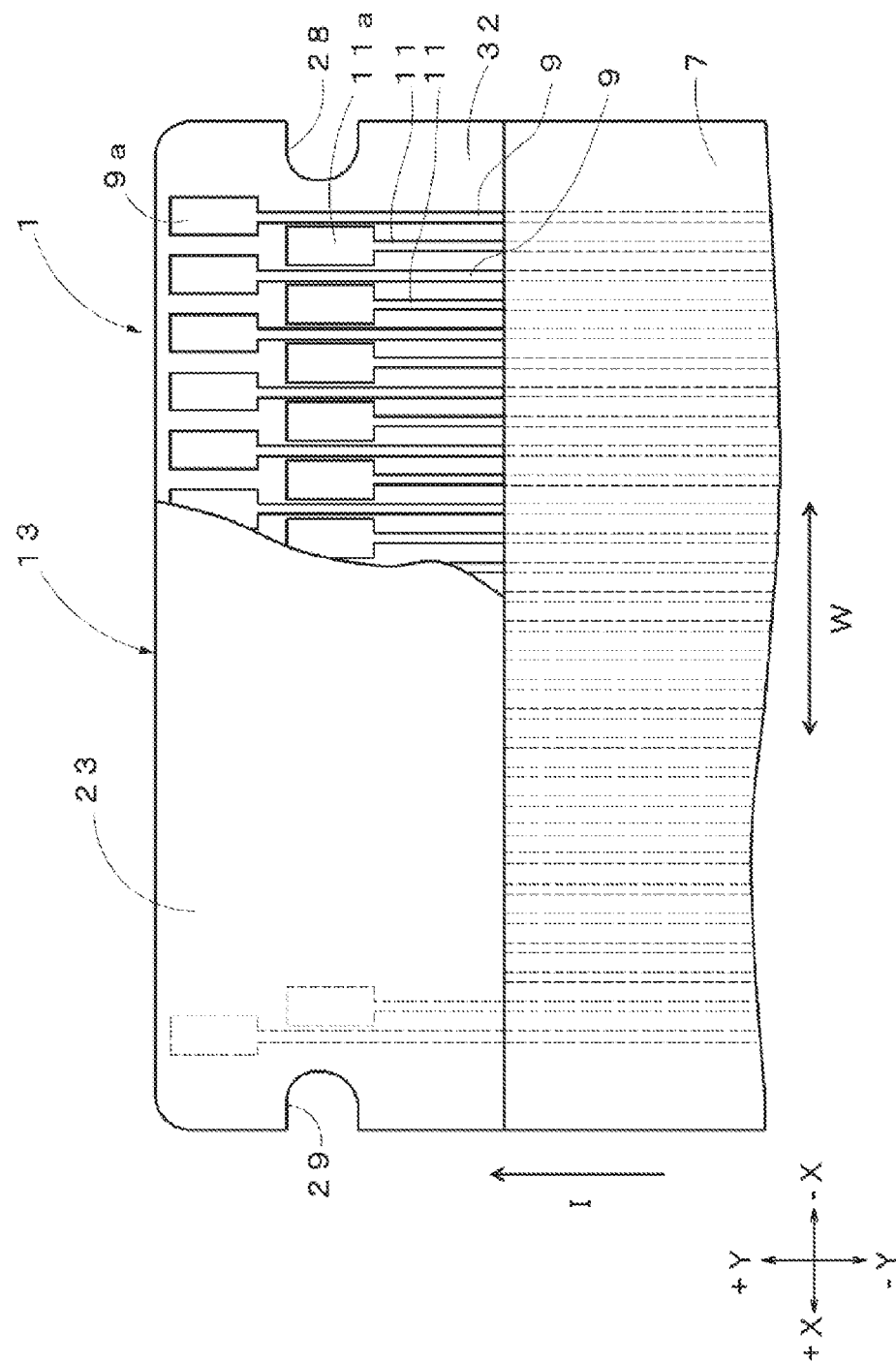

FIG.20
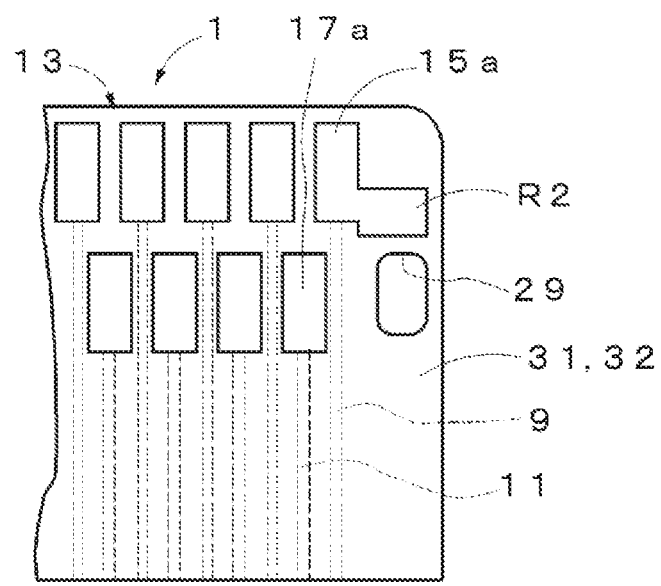
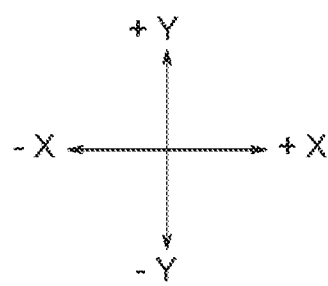

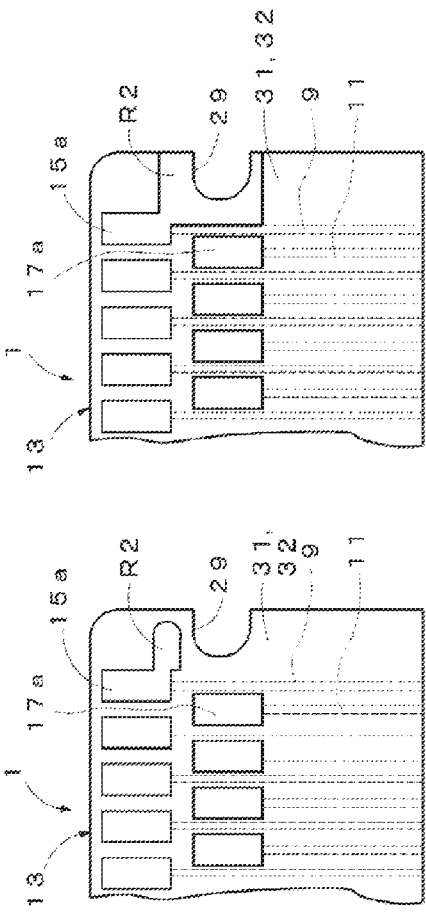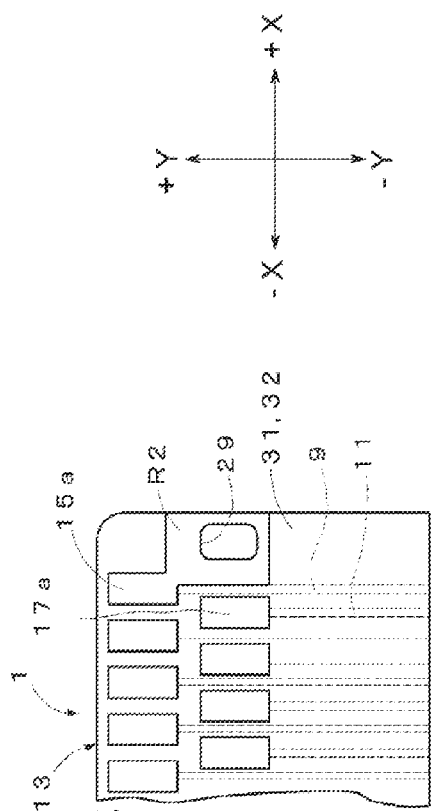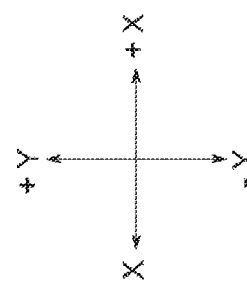

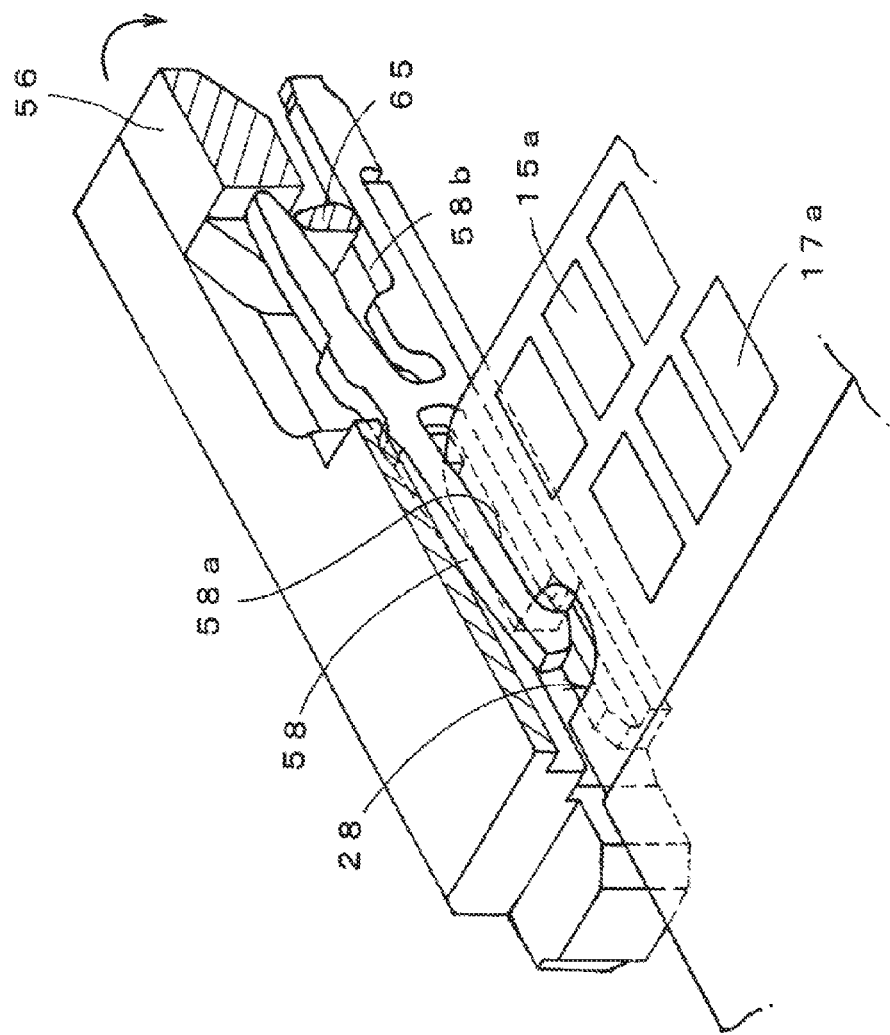

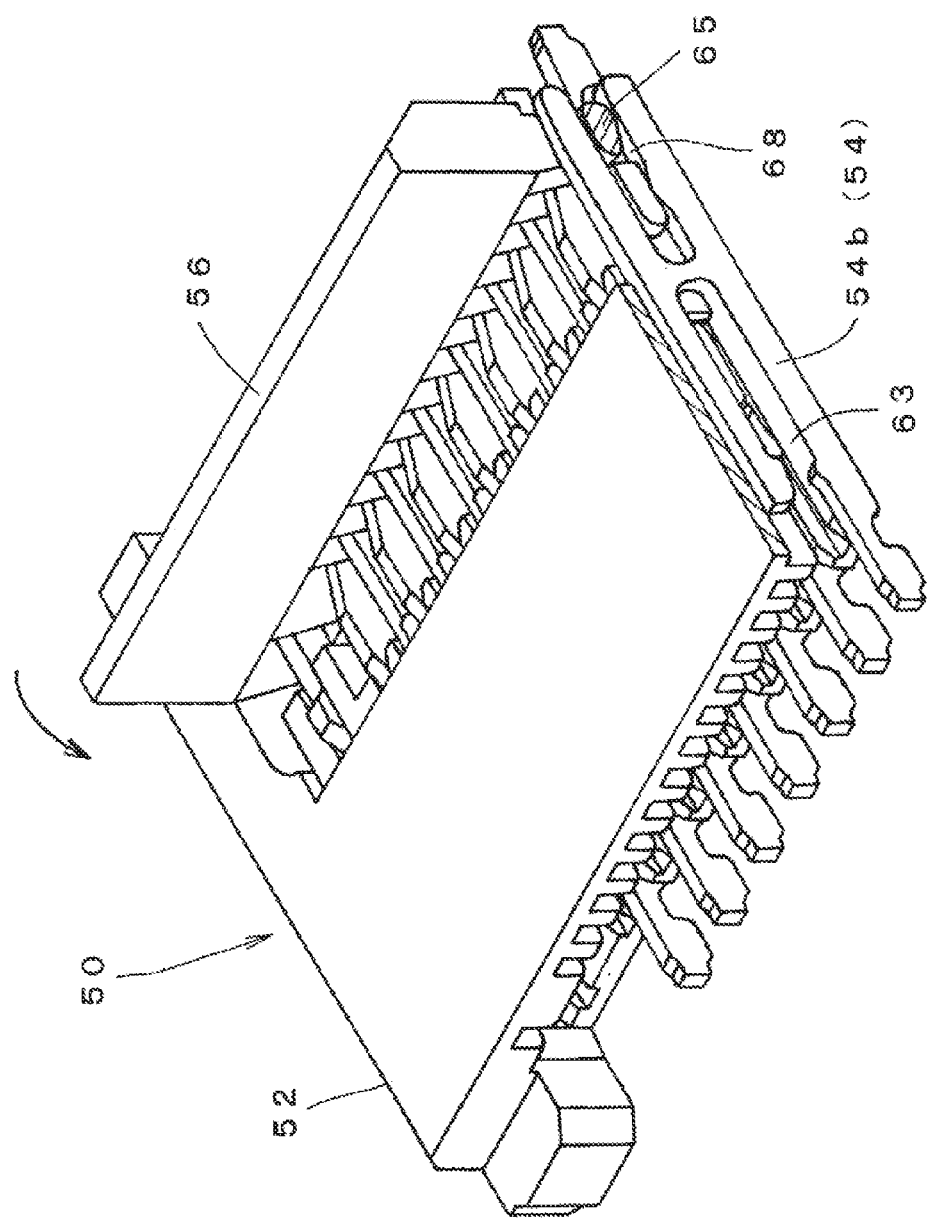

PRINTED WIRING BOARD

CROSS REFERENCE TO RELATED APPLICATIONS

This application is a National Stage of International Application No. PCT/JP2015/069956 filed Jul. 10, 2015, claiming priority based on Japanese Patent Application No. 2014-148767, filed Jul. 22, 2014, the contents of all of which are incorporated herein by reference in their entirety.

TECHNICAL FIELD

The present invention relates to a printed wiring board that is to be connected to another electronic component of an electronic device.

BACKGROUND ART

In accordance with reduction in the thickness and size of electronic devices and electronic components used in electronic devices, printed wiring boards to be connected to them via connectors are also required to have a reduced thickness and size. Reduction in the thickness and size of printed wiring boards, however, leads to deterioration in the engaging force between printed wiring boards and connectors. Therefore, if strong external force is applied to a printed wiring board connected to a connector, the printed wiring board may possibly be disconnected from the connector.

In view of preventing such disconnection of a printed wiring board from an electric connector for planar circuit boards, it is known to provide the printed wiring board with notches at locations opposite to each other at a pair of parallelly extending sides and fit engagement parts provided on the connector into the notches.

PRIOR ART DOCUMENT

Patent Document

[Patent Document 1] JP2007-227036A

SUMMARY OF INVENTION

Problems to be Solved by Invention

In a printed wiring board of a multilayer structure, however, it is difficult to enhance the engaging force between the printed wiring board and a connector while achieving a reduced thickness and size, which may be problematic.

A problem to be solved by the present invention is to enhance the engaging force between a printed wiring board of a multilayer structure and a connector while achieving a reduced thickness and size of the printed wiring board.

Means for Solving Problems (1) The present invention solves the above problem by providing a printed wiring board of a multilayer structure comprising: a plurality of substrates including a first substrate and a second substrate, the first substrate being formed with a plurality of pads on any one of main surfaces, the pads being to be electrically connected to a connector, the second substrate being laminated directly on or indirectly via a substrate other than the first substrate on any one of main surfaces of the first substrate, the second substrate being formed with wirings on any one of main surfaces; an engageable part formed at a connection end portion to be connected to the connector, the engageable part being to be engaged with an engagement part of the connector; and one or more reinforcement layers provided on one or more main surfaces possessed by the first substrate and/or the second substrate, the one or more reinforcement layers being provided at locations at a frontward side than a location at which the engageable part is provided, with reference to a connecting direction when the printed wiring board is connected to the connector, the plurality of pads formed on the first substrate being disposed within the connection end portion at one main surface side of the first substrate, the plurality of pads formed on the first substrate being arranged to form a front array and a rear array in two rows when viewed in the connecting direction to the connector, the wirings formed on the second substrate including first wirings and second wirings, the first wirings being connected through vias penetrating the one or more substrates to first pads of the front array among the plurality of pads arranged to form the front array and the rear array in two rows, the second wirings being connected through vias penetrating the one or more substrates to second pads of the rear array among the plurality of pads arranged to form the front array and the rear array in two rows, the wirings each having a part formed to have a constant width along an inserting direction to the connector and an expanded-width part expanded to have a wider width than the constant width at a side of the connection end portion in the inserting direction to the connector, the expanded-width part being provided at a location corresponding to each of the pads, the expanded-width parts including first expanded-width parts having approximately same shape as that of the first pads and second expanded-width parts having approximately same shape as that of the second pads.

(2) In the above invention, the above problem is solved by configuring the second substrate to have wirings formed on other main surface opposite to the one main surface of the second substrate.

(3) In the above invention, the above problem is solved by further comprising one or more third substrates, wherein each of the third substrates has wirings formed on one main surface and/or other main surface of the third substrate, wherein the one or more reinforcement layers are provided on one main surface and/or other main surface of any one or more of substrates among the plurality of substrates, wherein the one or more reinforcement layers are provided at locations at the frontward side than the location at which the engageable part is provided, with reference to the connecting direction to the connector.

(4) In the above invention, the above problem is solved by configuring the first substrate to include a substrate formed with the plurality of pads at one main surface side and a substrate formed with the plurality of pads at other main surface side opposite to the one main surface.

(5) In the above invention, the above problem is solved by providing the one or more reinforcement layers on one or more main surfaces among main surfaces formed with the wirings.

(6) In the above invention, the above problem is solved by forming the one or more reinforcement layers integrally with some of the wirings.

(7) In the above invention, the above problem is solved by forming the one or more reinforcement layers separately from the wirings.

(8) In the above invention, the above problem is solved by providing the one or more reinforcement layers on one or more main surfaces among main surfaces formed with the pads.

(9) In the above invention, the above problem is solved by forming the one or more reinforcement layers integrally with some of the pads.

(10) In the above invention, the above problem is solved by forming the one or more reinforcement layers separately from the pads.

(11) In the above invention, the above problem is solved by providing the printed wiring board which has an insulating layer covering surfaces of the one or more reinforcement layers.

Effect of Invention

According to the present invention, the engageable part and the reinforcement layer(s) are disposed at appropriate locations and it is therefore possible to enhance the engaging force between the printed wiring board of a multilayer structure and a connector while achieving a reduced thickness and size of the printed wiring board of a multilayer structure.

BRIEF DESCRIPTION OF DRAWING(S)

FIG. 3 is a cross-sectional view along line A-A illustrated in FIG. 1.

FIG. 4A is a perspective view schematically illustrating a relationship among wirings, a reinforcement layer and pads provided on one substrate among a plurality of substrates of the printed wiring board of FIG. 1.

FIG. 4B is a perspective view schematically illustrating a relationship among wirings, a reinforcement layer and pads provided on two substrates among a plurality of substrates of the printed wiring board of FIG. 1.

FIG. 6 is a partial bottom plan view illustrating a modified example of an engageable part of the printed wiring board of FIG. 1.

FIGS. 7A, 7B and 7C are partial bottom plan views illustrating modified examples of the reinforcement layer of the printed wiring board of FIG. 1.

FIG. 8 is a plan view illustrating a part of a printed wiring board of a second example according to an embodiment of the present invention.

FIG. 10B is a perspective view schematically illustrating a relationship among wirings, a reinforcement layer and pads provided on two substrates among a plurality of substrates of the printed wiring board of FIG. 8.

FIG. 11 is a partial bottom plan view illustrating a modified example of an engageable part of the printed wiring board of FIG. 8.

FIGS. 12A, 12B and 12C are partial bottom plan views illustrating modified examples of the reinforcement layer of the printed wiring board of FIG. 8.

FIG. 13 is a view illustrating a form of the printed wiring board of FIG. 8 in which an insulating layer is provided at the uppermost surface of the printed wiring board of FIG. 8.

FIG. 14 is a plan view illustrating a part of a printed wiring board of a third example according to an embodiment of the present invention.

FIG. 15 is a bottom plan view of the printed wiring board illustrated in FIG. 14.

FIG. 20 is a partial plan view illustrating a modified example of an engageable part of the printed wiring board of FIG. 17.

FIGS. 21A, 21B and 21C are partial plan views illustrating modified examples of the reinforcement layer of the printed wiring board of FIG. 17.

FIG. 26 is a partially-broken perspective view illustrating a state in which the printed wiring board is engaged with the connector.

FIG. 27 is a partially-broken perspective view illustrating a state in which a rotative member of the connector stands up.

MODE(S) FOR CARRYING OUT THE INVENTION

Hereinafter, embodiments of the present invention will be described with reference to the drawings.

The printed wiring board according to an embodiment of the present invention is a wiring board of a multilayer structure comprising a plurality of substrates. The printed wiring board 1 of the present embodiment has flexibility and is thus a flexible printed wiring board (i.e. FPC (flexible printed circuit) board). The present embodiment will be described with an exemplary case in which the printed wiring board is inserted in a ZIF (Zero Insertion Force) connector and used, but the present invention can also be applied to a non-ZIF connector that utilizes the thickness of a printed wiring board to obtain fitting force and other connectors such as a backboard connector. The present embodiment will be described with an example of a flexible printed wiring board, but the present invention can also be applied to any type of printed wiring boards, such as a rigid flexible printed wiring board.

The printed wiring board 1 of the present embodiment will be described below with reference to the drawings. For descriptive purposes in the present description, in a plan view, the direction in which the printed wiring board 1 approaches a connector when connected to the connector is referred to as a connecting direction (+Y direction or a connecting direction I in the figures) while the direction which is approximately orthogonal to the connecting direction is referred to as a width direction (+X/−X direction or a width direction W in the figures). As for the laminating direction of the printed wiring board 1, the upper layer side or upper surface direction in the laminate structure of the printed wiring board 1 is referred to as an upper side (+Z direction in the figures) while the lower layer side or lower surface direction in the laminate structure of the printed wiring board is referred to as a lower side (−Z direction in the figures). Among one main surface and the other main surface that are possessed by each substrate to be laminated, the upper surface (surface at the side of +Z direction in the figures) is referred to as "the one main surface" while the lower surface (surface at the side of −Z direction in the figures) of each substrate is referred to as "the other main surface." It is to be noted that "any one of main surfaces" refers to either the one main surface or the other main surface and is not limited to the one main surface or the other main surface.

Figure 1:
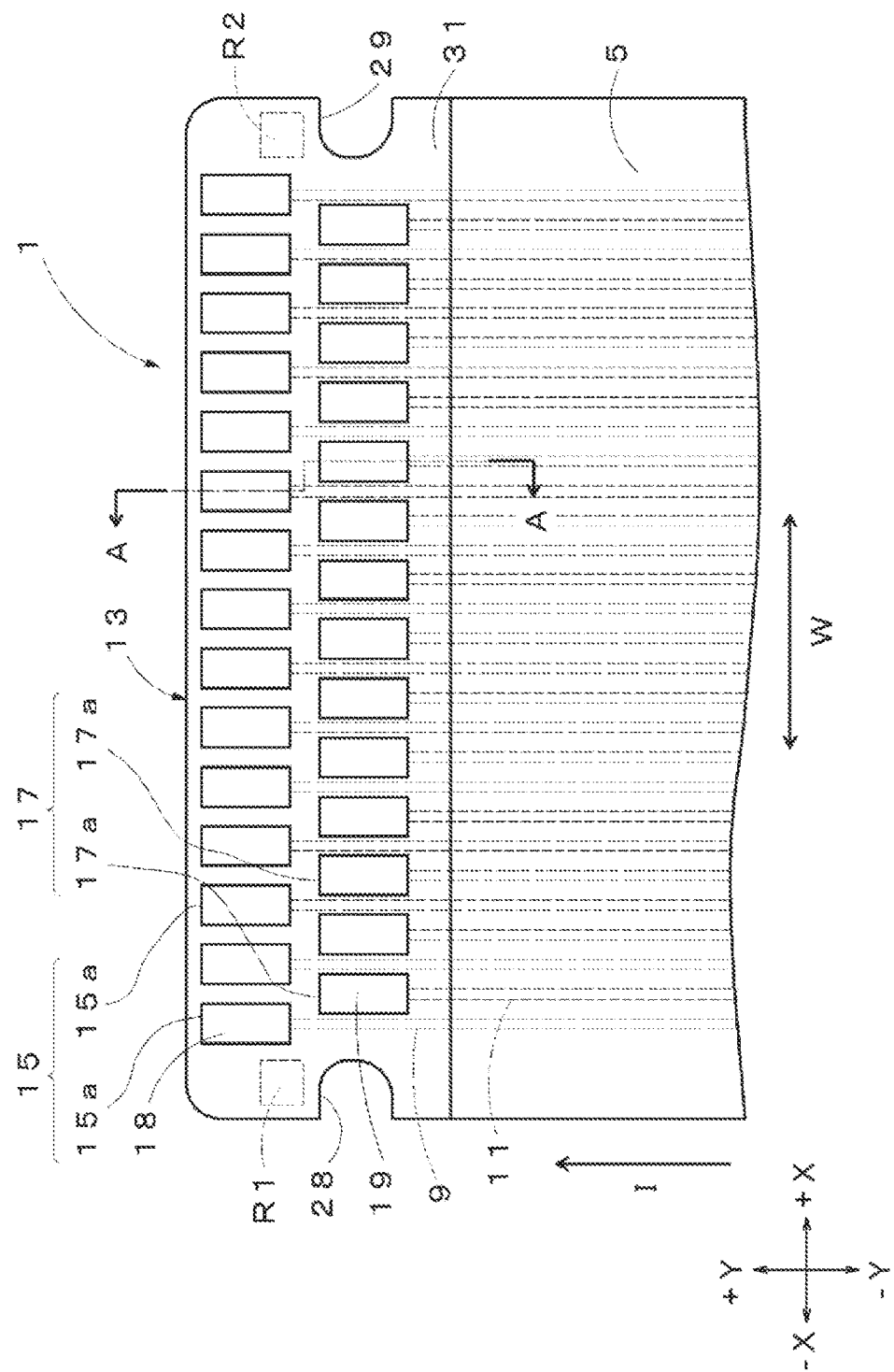
FIG. 1 is a plan view illustrating a part of a printed wiring board of a first example according to an embodiment of the present invention.
Figure 2:
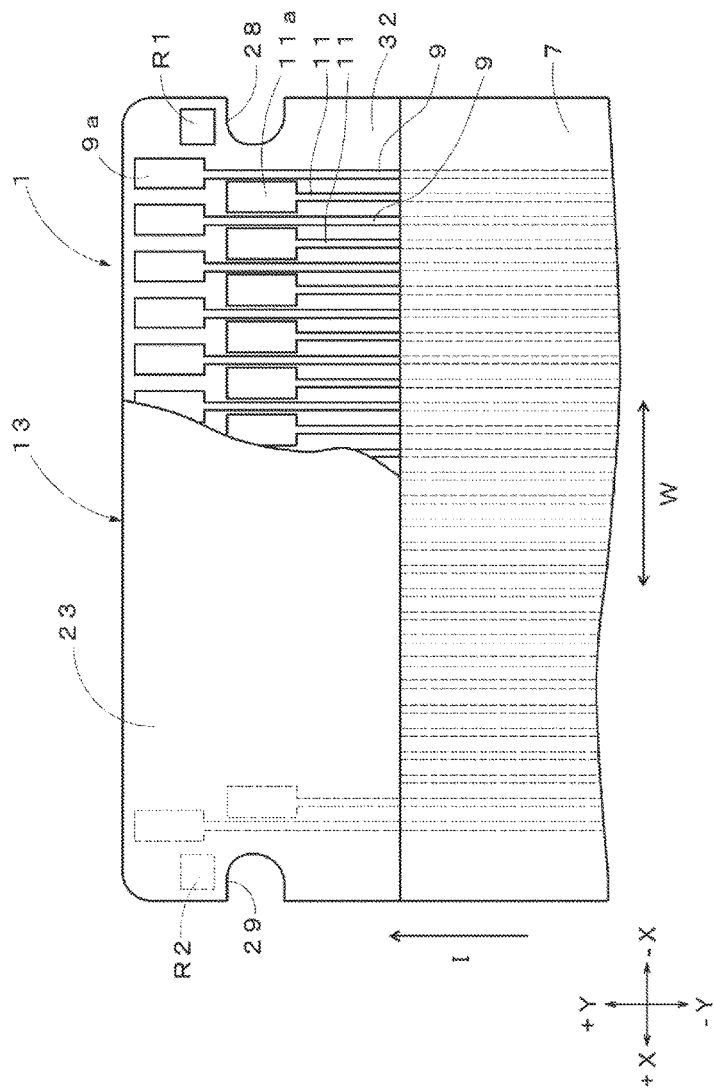
FIG. 2 is a bottom plan view of the printed wiring board illustrated in FIG. 1.

A specific form of the printed wiring board 1 according to the present embodiment will be described with reference to FIG. 1 to FIGS. 4A and 4B. FIG. 1 is a plan view of the printed wiring board 1 according to the present embodiment and FIG. 2 is a bottom plan view of the printed wiring board 1 according to the present embodiment. FIG. 3 is a cross-sectional view along line A-A illustrated in FIG. 1. For simplified description in this example, a three-layer laminate structure will be exemplified, but the number of laminated layers in the printed wiring board 1 according to the present embodiment is not limited. FIG. 4A is a perspective view schematically illustrating a relationship among pads, wirings provided on one substrate among a plurality of substrates, and a reinforcement layer. For descriptive purposes, in FIG. 4A, the wirings, reinforcement layer and pads provided on adjacent substrates are extracted to be illustrated. Similarly, in FIG. 10A, FIG. 16 and FIG. 19 which correspond to FIG. 4A, the wirings, reinforcement layer and pads provided on adjacent substrates are extracted to be illustrated.

The printed wiring board 1 of the present embodiment comprises a plurality of substrates. The substrates according to the present embodiment include at least a first substrate 31 and a second substrate 32. The printed wiring board 1 of the present embodiment includes a third substrate 33. The printed wiring board 1 of the present embodiment may further include one or more other substrates 34 that have different structures from those of the first substrate 31, second substrate 32 and third substrate 33. In the present embodiment, each of the other substrates 34 is a substrate provided with wirings that are not electrically connected to pads 15a and 17a. The first substrate 31, second substrate 32, third substrate 33 and other substrates 34 may be collectively referred to as a substrate 3 or substrates 3, hereinafter.

As illustrated in FIGS. 1 and 2, the printed wiring board 1 of the present embodiment has a connection end portion 13 at least at one end portion in the connecting direction (inserting direction) I. When the printed wiring board 1 is connected to a connector, the connection end portion 13 is moved in the connecting direction I illustrated in the figures (+Y direction in the figures) and inserted in an insertion opening of the connector, which will be described later. In this insertion of the connection end portion 13, the frontward side when the connection end portion 13 moves toward the connector insertion opening is defined as a frontward side in the connecting direction I.

The printed wiring board 1 of the present embodiment is a wiring board of a multilayer structure that comprises a plurality of substrates 3. The printed wiring board 1 comprises at least a first substrate 31 and a second substrate 32. Although not illustrated in FIGS. 1 and 2, the printed wiring board 1 of the present embodiment may further comprise one or more third substrates 33. The printed wiring board 1 of the present embodiment may further comprise one or more other substrates 34. FIG. 1 to FIG. 3 exemplify the printed wiring board 1 in which the first substrate 31 is disposed at the uppermost side, the second substrate 32 is disposed at the lowermost side, and the third substrate 33 is disposed between the first substrate 31 and the second substrate 32, but the form of laminate is not limited to this. The third substrate 33 may be laminated on the first substrate 31 at the one main surface side or at the other main surface side and may also be laminated on the second substrate 32 at the one main surface side or at the other main surface side. The number of third substrates 33 to be laminated is not limited. The third substrate 33 may be laminated on the first substrate 31 at the one main surface side while another third substrate 33 may be laminated on the second substrate 32 at the other main surface side. A single third substrate 33 may be disposed between the first substrate 31 and the second substrate 32 or a plurality of third substrates 33 may also be laminated between the first substrate 31 and the second substrate 32. Locations of disposing the other substrates 34 and the number of disposing the other substrates 34 are not limited. Thus, the form of the multilayer structure can be appropriately changed in accordance with the requirement at the time of use.

The substrates 3 of the present embodiment, which include the first substrate 31, second substrate 32, third substrate or substrates 33 and other substrate or substrates 34, have flexibility. Each of the substrates 3 is formed of an insulating resin. Examples of the insulating resin include, for example, polyimide, polyester, and polyethylene naphthalate. The first substrate 31, second substrate 32, third substrate or substrates 33 and other substrate or substrates 34 may be made of the same resin or may also be made of different resins.

Each substrate 3 of the printed wiring board 1 according to the present embodiment will be described below.

First, the first substrate 31 will be described.

As illustrated in FIG. 1, the first substrate 31 has a plurality of pads 15 and 17 that are to be electrically connected to a connector. The pads 15 and 17 are formed on any one of main surfaces of the first substrate 31.

In the printed wiring board 1 illustrated in FIG. 1, the pads 15 and 17 are provided within a predetermined region that includes the connection end portion 13 at the upper surface side of the first substrate 31. The pads 15 and 17 are disposed at different positions along the connecting direction I to form front and rear arrays in two rows. The pads 15 are disposed at an outer edge side (+Y side in the figure) of the connection end portion 13 in the connecting direction I and the pads 17 are disposed behind the pads 15 (−Y side in the figure). The pads 15 and 17 are disposed such that the center position of each pad 17 is aligned with the center position between two adjacent pads 15 along the width direction W (+/−Y direction).

The arrangement of pads 15a and 17a is not limited to the above, and locations of the pads 15a of the front array along the width direction of W direction and locations of the pads 17a of the rear array along the width direction W may be the same locations. In this case, the pads 15a of the front array and the pads 17a of the rear array are arranged in straight lines along the connecting direction I. In this form, the pads 15a of the front array are connected to first wirings 9 at the other main surface of the first substrate 31 or at another layer, and the pads 17a of the rear array are connected to second wirings 11 at the one main surface of the first substrate 31. According to this arrangement, the width of the printed wiring board 1 can be reduced compared with the case of the same number of pads that are alternately disposed as illustrated in FIG. 1.

The present embodiment is described with reference to an example of the printed wiring board 1 which has a single first substrate 31, but the printed wiring board 1 may be configured to have a plurality of first substrates 31 in view of achieving electrical connection at both surfaces. The printed wiring board 1 of the present embodiment may be configured to have two first substrates 31, that is, a first substrate 31 of a type formed with a plurality of pads 15 and 17 at the one main surface side and another first substrate 31 of a type formed with a plurality of pads 15 and 17 at the other main surface side. Specifically, while the printed wiring board 1 illustrated in FIGS. 1 to 4 is provided with the pads 15 and 17 on the one main surface of the first substrate 31 as the uppermost surface (uppermost surface at +Z side of FIG. 4A), another first substrate 31 is laminated at the lowermost layer side of the printed wiring board 1 and pads 15 and 17 are formed on the other main surface of the other first substrate 31 as the lowermost surface (lowermost surface at −Z side of FIG. 4A). This structure allows provision of the printed wiring board 1 of a both-sides connectable type which can be connected to a connector at both sides, that is, at the one main surface side and at the other main surface side. Thus, the printed wiring board 1 of a reduced thickness and size can be realized while increasing the amount of information to be output.

The uppermost surfaces of the pads 15a and 17a are subjected to surface treatment. Surface-treated layers 18 and 19 have conductivity. In the present embodiment, a plating process is performed as the surface treatment. The surface-treated layers 18 and 19 have necessary properties, such as corrosion resistance and wear resistance, and protect the pads 15a and 17a. In the present embodiment, a gold plating process is performed as the surface treatment. Materials used for formation of gold plated layers that are formed by the gold plating process are not particularly limited. The gold plated layers may include nickel layers as underlying layers. Schemes for formation of surface-treated layers, such as plated layers, are also not particularly limited. Materials and schemes which are known in the art at the time of filing of the present application can be appropriately used. The surface-treated layers 18 and 19 may also be conductive carbon layers or solder layers.

Locations at which the pads 15 and 17 are provided are not particularly limited, provided that they can function as contacts with a connector. The pads 15 and 17 may be provided on any one of main surfaces of the first substrate 31, that is, any one of the one main surface and the other main surface of the first substrate 31. As will be understood, locations of the first substrate 31 at which the pads 15 and 17 are laminated are not particularly limited. Therefore, one or more substrates other than the first substrate 31 (the second substrate 32, third substrate or substrates 33, and/or other substrate or substrates 34) may be laminated on the main surface of the first substrate 31 on which the pads 15 and 17 are provided. In such cases, the pads 15 and 17 are made in a state of being exposed (in a state of connectable) so that they can function as contacts with a connector. The pads 15 and 17 may be formed on a substrate 3 that is formed with the first wirings 9 and second wirings 11, which will be described later, or may also be formed on a substrate 3 that is different from the substrate 3 which is formed with the first wirings 9 and second wirings 11. The pads 15 and 17 may be formed on a main surface that is formed with the first wirings 9 and second wirings 11, which will be described later, or may also be formed on a main surface that is different from the main surface which is formed with the first wirings 9 and second wirings 11. The pads 15 and 17 may be formed on a substrate 3 that is formed with reinforcement layers R1 and R2, which will be described later, or may also be formed on a substrate 3 that is different from the substrate 3 which is formed with the reinforcement layers R1 and R2. The pads 15 and 17 may be formed on a main surface that is formed with the reinforcement layers R1 and R2, which will be described later, or may also be formed on a main surface that is different from the main surface which is formed with the reinforcement layers R1 and R2.

The pads 15 and 17 in the present embodiment are electrically connected to wirings that are formed on any of the second substrate 32 and third substrate or substrates 33. The present embodiment will be described with reference to an example in which the pads 15 and 17 formed on the first substrate 31 are electrically connected to the first wirings 9 and second wirings 11 formed on the second substrate 32 and/or on the third substrate or substrates 33.

Next, the second substrate 32 will be described.

As illustrated in FIG. 1, the second substrate 32 is formed directly on or indirectly via the third substrate or substrates 33 and/or other substrate or substrates 34, which will be described later, on any one of main surfaces (i.e. the one main surface or the other main surface) of the first substrate 31. Any one of main surfaces of the second substrate 32 is formed with the first wirings 9 and second wirings 11 which are electrically connected to one or more pads 15 and 17 through vias 24 and 25 that penetrate one or more substrates 3 among the plurality of first to third substrates 31 to 33 and other substrate or substrates 34. The substrates 3 formed with the vias 24 and 25 include the first substrate 31, second substrate 32 itself, third substrate or substrates 33, and/or other substrate or substrates 34. First wirings 9 and second wirings 11 that are electrically connected to the pads 15 and 17 may also be formed on the other main surface opposite to any one of main surfaces of the second substrate 32. In an alternative embodiment, the first wirings 9 and the second wirings 11 may be formed on each of both the one main surface and the other main surface of the second substrate 32.

Then, the third substrate or substrates 33 will be described.

The printed wiring board 1 of the present embodiment comprises the third substrate or substrates 33 in addition to the first substrate 31 and second substrate 32. FIG. 3 illustrates an example of the printed wiring board 1 which includes a single third substrate 33, but the printed wiring board 1 may also include a plurality of third substrates 33. In the present embodiment, an example is described in which the third substrate 33 is disposed between the first substrate 31 and the second substrate 32, but the third substrate or substrates 33 may also be laminated on the first substrate 31 at the upper side (+Z direction of FIG. 3) and/or on the second substrate 32 at the lower side (−Z direction of FIG. 3).

Each third substrate 33 has first wirings 9 and second wirings 11 that are formed on the one main surface and/or the other main surface of the third substrate 33. The first wirings 9 and second wirings 11 of the third substrate 33 are electrically connected to the pads 15 and 17 through the vias 24 and 25 which penetrate one or more substrates 3.

Each of the other substrates 34 is a substrate having wirings that are not electrically connected to the pads 15a and 17a, on its one main surface or both main surfaces.

Next, the first wirings 9 and the second wirings 11 will be described.

The first wirings 9 and second wirings 11 in the present embodiment are provided side by side in the width direction (W direction illustrated in FIG. 1) of the printed wiring board 1 on one or more main surfaces of the substrates 3 and extend along the connecting direction I. The first wirings 9 and the second wirings 11 are formed using a conductive material. Examples of the conductive material to be used include, for example, copper and copper alloy. The surfaces (exposed surfaces) of the first wirings 9 and second wirings 11 may be formed with surface-treated layers (e.g. metal plated layers) 43.

The first wirings 9 and second wirings 11 in the present embodiment are electrically connected to one or more pads 15a and 17a through the vias 24 and 25 which penetrate the substrates 3 (including one or more of the first substrate 31, second substrate 32, third substrate or substrates 33, and other substrate or substrates 34). The first wirings 9 and second wirings 11 in the present embodiment are formed on any one of main surfaces of the second substrate 32 which is laminated directly on or indirectly via other substrates 3 than the first substrate 31 and second substrate 32 (third substrate or substrates 33 and/or other substrate or substrates 34) on any one of main surfaces of the first substrate 31. The first wirings 9 and second wirings 11 in the present embodiment are electrically connected to the pads 15a and 17a, which are formed on the first substrate 31, through the vias penetrating the substrates 3.

The relationship of connection among the pads 15a and 17a, first wirings 9 and second wirings 11 is not particularly limited and a desired relationship of connection can be realized by appropriately applying a method of manufacturing multilayer-type printed wiring boards which is known in the art at the time of filing of the present application. For descriptive purposes, FIG. 3 illustrates an example in which the first wirings 9 (32, 33) and second wirings 11 (32, 33) formed on the second substrate 32 and third substrate 33 are the same patterns, but they may also be different patterns.

As illustrated in FIG. 3, the second substrate 32, which is disposed as the lowermost layer of the printed wiring board 1, has the first wirings 9 (32) connected to the pads 15a of the front array and the second wirings 11 (32) connected to the pads 17a of the rear array. The first wirings 9 (32) and the second wirings 11 (32) are located on the other main surface of the second substrate 32. The first wirings 9 (32) and/or the second wirings 11 (32) may be formed on any one of main surfaces of the second substrate 32 or on both the main surfaces.

As illustrated in FIG. 3, the third substrate 33 disposed between the first substrate 31 and the second substrate 32 is provided with the first wirings 9 and second wirings 11 on both the one main surface and the other main surface. The first wirings 9 (33) connected to the pads 15a of the front array and the second wirings 11 (33) connected to the pads 17a of the rear array are formed on both main surfaces of the third substrate 33. The first wirings 9 (33) and/or the second wirings 11 (33) may also be formed only on any one of main surfaces of the third substrate 33.

Although not illustrated, the first wirings 9 connected to the pads 15a of the front array and the second wirings 11 connected to the pads 17a of the rear array may be provided on the one main surface of the first substrate 31 which is disposed as the uppermost layer of the printed wiring board 1. In other words, the pads 15 and 17, the first wirings 9 and the second wirings 11 may be formed on the one main surface of the first substrate 31. When both the first wirings 9 and the second wirings 11 are formed on the uppermost surface of the first substrate 31, an upper surface side coverlay 5 may preferably be provided as illustrated in FIG. 1. When both the first wirings 9 and the second wirings 11 are formed on a surface other than the uppermost surface of the first substrate 31, the upper surface side coverlay 5 may not be provided. The first wirings 9 and the second wirings 11 may also be provided on the other main surface of the first substrate 31. In this case, an insulation layer is interposed between the first substrate 31 and the third substrate 33. As will be understood, the first wirings 9 (33) and/or the second wirings 11 (33) may be formed on any one of main surfaces or both the main surfaces of the first substrate 31 which is disposed as the uppermost layer of the printed wiring board 1.

In the printed wiring board 1 in which the third substrate 33 and the second substrate 32 are laminated at adjacent locations along the laminating direction, the first wirings 9 and second wirings 11 formed between the third substrate 33 and the second substrate 32 may be expressed as first wirings 9 (32) and second wirings 11 (32), respectively, which are formed on the one main surface (or the other main surface) of the second substrate 32, or may also be expressed as first wirings 9 (33) and second wirings 11 (33), respectively, which are formed on the other main surface (or the one main surface) of the third substrate 33.

As illustrated in FIG. 3 and FIG. 4A, each of the pads 15a of the front array and each of the first wirings 9 (33) disposed on the one main surface of the third substrate 33 are connected to each other through a via 24 that penetrates the first substrate 31. Each of the pads 17a of the rear array and each of the second wirings 11 (33) disposed on the one main surface of the third substrate 33 are connected to each other through a via 25 that penetrates the first substrate 31. In the illustrated example, one via 24 and one via 25 are provided for each pad 15a and each pad 17a, respectively, but two or more vias 24 and two or more vias 25 may be provided for each pad 15a and each pad 17a, respectively, in view of improving the stability of the pads 15a and 17a, reducing the electrical resistance, etc.

As illustrated in FIG. 4A, the first wirings 9 and second wirings 11 in the present embodiment have expanded-width parts 9a and 11a, respectively, at locations corresponding to the pads 15*a* 17*a* located above. The expanded-width parts 9*a* and 11*a* are not in direct contact with a connector of another electronic component. The expanded-width parts 9*a* and 11*a* maintain the thickness of the printed wiring board 1 to be constant at locations of the pads 15*a* and 17*a*. This improves the creep resistance. The expanded-width parts 9*a* and 11*a* are provided at locations corresponding to the pads 15*a* and 17*a* of the first wirings 9 and second wirings 11 thereby to allow the height for contact with a connector to be uniform within the regions of the expanded-width parts 9*a* and 11*a*. Even if the printed wiring board 1 and the connector are misaligned to some extent with regard to the contact positions, the height for contact with the connector is maintained within the regions of the expanded-width parts 9*a* and 11*a* and the creep resistance can therefore be improved. Therefore, a stable connection state between the pads 15*a* and 17*a* and the connector can be maintained for a long time. In particular, the expanded-width parts 9*a* and 11*a* have shapes corresponding to those of the pads 15*a* and 17*a* in the present embodiment thereby to steadily obtain the above-described effects. If, on the other hand, expanded-width parts are not provided at locations at the other main surface side of the first substrate 31 corresponding to the pads 15*a* and 17*a* at the one main surface side of the first substrate 31, creep deformation may occur in an adhesive layer. In particular, such creep deformation of the adhesive layer may be significant under a high-temperature environment. If the creep deformation of the adhesive layer occurs in the printed wiring board 1, the thickness of the printed wiring board 1 will be ununiform. This may possibly result in poor electrical contact properties of the printed wiring board 1.

In the present embodiment, the shapes of the expanded-width parts 9*a* and 11*a* are made to correspond to the shapes of the pads 15*a* and 17*a*. In the present embodiment, the shapes of the expanded-width parts 9*a* and 11*a* are made to be rectangular shapes that are approximately the same as the shapes of the pads 15*a* and 17*a*. In an alternative embodiment, the expanded-width parts 9*a* and 11*a* may be formed smaller or larger than the pads 15*a* and 17*a*, provided that the stability of contact between the pads 15*a* and 17*a* and a connector of another electronic component does not deteriorate. In an embodiment, the expanded-width parts 9*a* and 11*a* may not be provided. In an embodiment, one or more reinforcement parts may be formed as substitute for the expanded-width parts 9*a* and 11*a* on the main surface on which the expanded-width parts 9*a* and 11*a* are not formed at locations that correspond to the pads 15*a* and 17*a* in the laminating direction (Z direction in the figures). This is because such reinforcement parts can stabilize the contact at the pads 15*a* and 17*a*.

As described above, locations at which the first wirings 9 and the second wirings 11 are provided are not particularly limited. The first wirings 9 and the second wirings 11 may be provided on any one of main surfaces of the first substrate 31, that is, on the one main surface or the other main surface of the first substrate 31. The first wirings 9 and the second wirings 11 may be provided on any one of main surfaces of the second substrate 3, that is, on the one main surface or the other main surface of the second substrate 32. The first wirings 9 and the second wirings 11 may be provided on any one of main surfaces of the third substrate 33, that is, on the one main surface or the other main surface of the third substrate 33. The first wirings 9 may be provided on the one main surface or the other main surface of the first substrate 31 while the second wirings 11 may be provided on the one main surface or the other main surface opposite to the main surface of the first substrate 31 on which the first wirings 9 are provided. The first wirings 9 may be provided on the one main surface or the other main surface of the second substrate 32 while the second wirings 11 may be provided on the one main surface or the other main surface opposite to the main surface of the second substrate 32 on which the first wirings 9 are provided. The first wirings 9 may be provided on the one main surface or the other main surface of the third substrate 33 while the second wirings 11 may be provided on the one main surface or the other main surface opposite to the main surface of the third substrate 33 on which the first wirings 9 are provided. The first wirings 9 and/or the second wirings 11 can be formed on a plurality of main surfaces of the substrates 3. The first wirings 9 and/or the second wirings 11 can be formed on a plurality of different main surfaces. The first wirings 9 may be provided on the one main surface or the other main surface of any substrate 3 while the second wirings 11 may be provided on the one main surface or the other main surface of the substrate 3 other than the main surface on which the first wirings 9 are provided.

The first wirings 9 and second wirings 11 and the pads 15 and 17 may be formed on the same substrate 3 or may also be formed on different substrates 3. The first wirings 9 and second wirings 11 and the pads 15 and 17 may be formed on the same main surface or may also be formed on different main surfaces.

The first wirings 9 and second wirings 11 and the reinforcement layers R1 and R2, which will be described later, may be formed on the same substrate 3 or may also be formed on different substrates 3. The first wirings 9 and second wirings 11 and the reinforcement layers R1 and R2, which will be described later, may be formed on the same main surface or may also be formed on different main surfaces.

With regard to the arrangement of the first wirings 9 and second wirings 11, both the first wirings 9 connected to the pads 15*a* of the front array and the second wirings 11 connected to the pads 17*a* of the rear array may be disposed on the one main surface or the other main surface of the third substrate 33, may be disposed on the one main surface or the other main surface of the second substrate 32, or may be disposed on the one main surface or the other main surface of the first substrate 31. According to this arrangement, wirings at the uppermost surface side of the printed wiring board 1 (at the one main surface side of the first substrate 31) can be eliminated. This allows an increased space to be obtained for mounting chips and other electronic components on the surface of the printed wiring board 1. In addition, the upper surface side coverlay 5 can be omitted by eliminating wirings at the one main surface side of the printed wiring board 1. Omission of the upper surface side coverlay 5 can avoid bending stress of the first wirings 9 and second wirings 11 which would be concentrated at an end portion of the upper surface side coverlay 5. This results in prevention of wire breakage due to concentration of bending stress of the first wirings 9 and second wirings 11.

The upper surface side coverlay 5 is attached to the one main surface (the upper surface, or the surface in +Z direction) of the first substrate 31 via an adhesive layer 4. A lower surface side coverlay 7 is attached to the other main surface (the lower surface opposite to the upper surface, or the surface in −Z direction) of the second substrate 32 via an adhesive layer 6. The upper surface side coverlay 5 and the lower surface side coverlay 7 form insulation layers. The upper surface side coverlay 5 and the lower surface side coverlay 7 can be formed by attaching insulating resin films such as polyimide films or applying and curing a thermoset ink, ultraviolet curable ink, or photosensitive ink. Further, a reinforcement film 23 is attached via an adhesive layer 21 to the outer surface of the lower surface side coverlay 7 which is attached to the other main surface of the second substrate 32. A polyimide film can be used, for example, as the reinforcement film 23.

Figure 5:
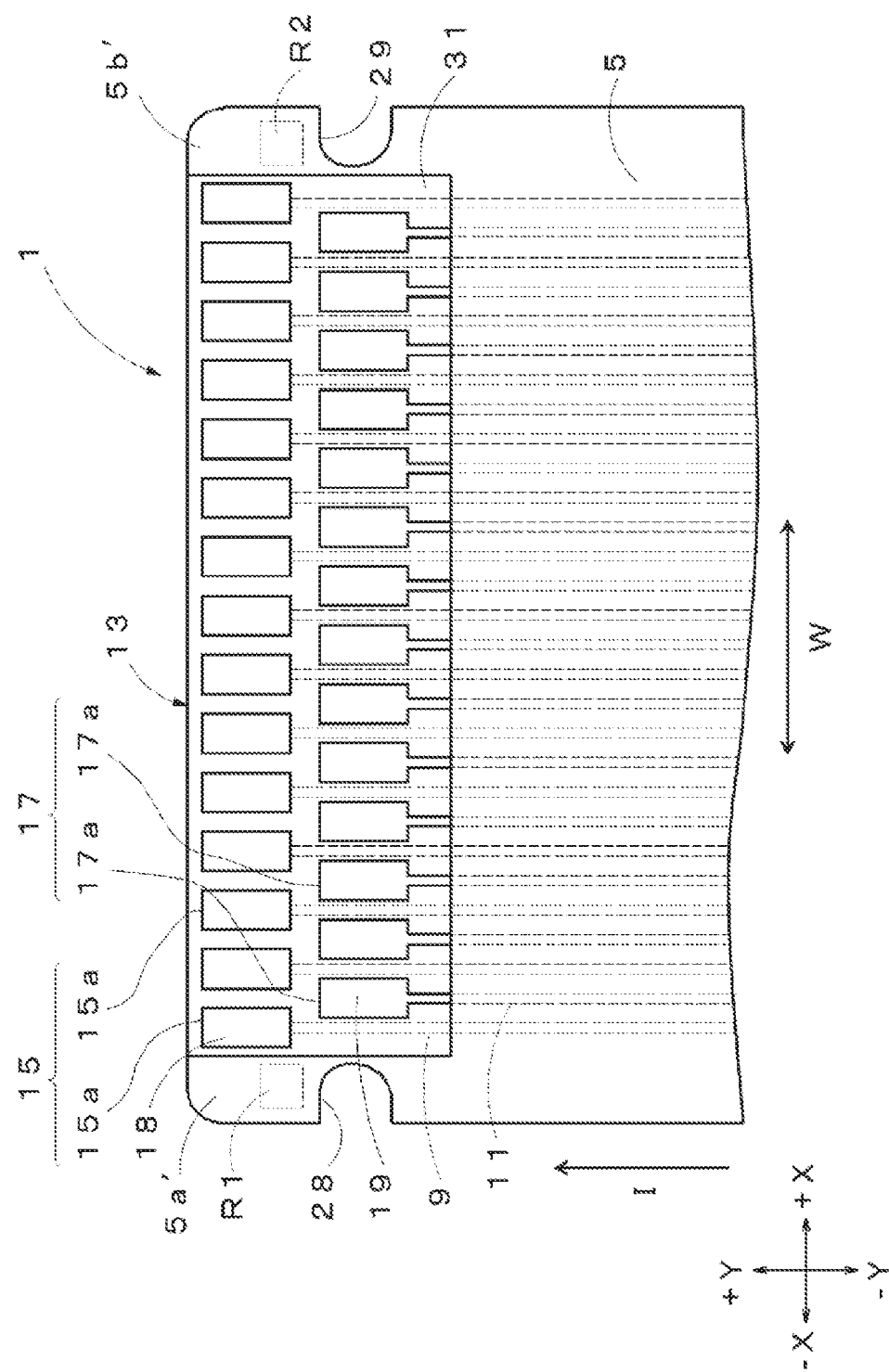
FIG. 5 is a view illustrating a form of the printed wiring board of FIG. 1 in which an insulating layer is provided to cover the reinforcement layers at the uppermost surface of the printed wiring board of FIG. 1.

The upper surface side coverlay 5 and lower surface side coverlay 7 in the present embodiment may preferably be disposed so as to cover the surfaces of reinforcement layers R1 and R2 which will be described later. FIG. 5 illustrates an example of the form of the upper surface side coverlay 5 which is formed so as to cover the reinforcement layers R1 and R2. The upper surface side coverlay 5 has extending parts 5a' and 5b' at its left-side and right-side end portions, respectively. The extending parts 5a' and 5b' extend toward the connection end portion 13 side along the connecting direction I. The extending parts 5a' and 5b' of the upper surface side coverlay 5 cover regions that correspond to the reinforcement layers R1 and R2 which are formed separately from the wirings 9a and 11a disposed on the lower layer of the pads 15a and 17a. As illustrated in the figure, the upper surface side coverlay 5 does not cover a certain region on which the pads 15 and 17 are disposed. Provision of the upper surface side coverlay 5 having the extending parts 5a' and 5b' which cover the surfaces of the reinforcement layers R1 and R2 and provision of the lower surface side coverlay 7 can improve resistance properties against the force in the disconnecting direction of the printed wiring board 1.

Next, engageable parts 28 and 29 of the printed wiring board 1 according to the present embodiment will be described.

The printed wiring board 1 of the present embodiment has one or more engageable parts 28 and 29. The engageable parts 28 and 29 are formed at the connection end portion 13 which is to be connected to a connector. Each of the engageable parts 28 and 29 has a structure that is engaged with an engagement part of the connector. The engageable parts 28 and 29 are engaged with the engagement parts (e.g. tab-like lock members provided at the connector which will be described later) of another electronic component, which is an object of connection with the printed wiring board 1, by force in the disconnecting direction (opposite direction to the connecting direction I).

As illustrated in FIGS. 1 and 2, the printed wiring board 1 of the present embodiment has the engageable parts 28 and 29 at least at one end edge or both end edges of both right and left sides in the width direction W of the connection end portion 13. In the present embodiment the engageable parts 28 and 29 are provided at end edges of both right and left sides in the width direction W. Engagement of the substrates 3 at both right and left sides of the printed wiring board 1 can enhance the disconnection resistance and maintain a stable engagement state. The right and left engageable parts 28 and 29 are formed at the same locations along the connecting direction I (Y-axis direction in the figures). This allows the equal force to be applied to the right and left engageable parts 28 and 29 and a stable engagement state can therefore be maintained.

The engageable parts 28 and 29 illustrated in FIGS. 1 and 2 are provided as notched parts that are formed at the side edge parts of the connection end portion 13. The form of the engageable parts 28 and 29 is not limited. The notched parts which constitute the engageable parts 28 and 29 may be in a form in which the laminated substrates 3 as a whole are notched into the same shape, or may also have a structure in which the area (area in XY plane) of the notched parts (parts to be removed) increases or decreases as approaching the upper surface or the lower surface. In another possible structure, parts at the upper surface side or parts at the lower surface side of the laminated substrates 3 may remain without being removed. The notched parts may include the outer profile of the substrates 3 or may also be formed as through-holes that, as illustrated in FIG. 6, do not include the outer profile of the substrates 3. In an alternative embodiment, the engageable parts 28 and 29 may be formed as recessed parts with bottoms in which the lower side substrate or substrates are not opened, or may also be formed as recessed parts with lids in which the upper side substrate or substrates remain.

Next, the reinforcement layers R1 and R2 of the printed wiring board 1 according to the present embodiment will be described.

The reinforcement layers R1 and R2 of the printed wiring board 1 according to the present embodiment are provided at the frontward side of the engageable parts 28 and 29 in the connecting direction I, that is, with reference to the connecting direction I. Again, the connecting direction I is the direction of connection with another electronic component. In the examples of FIGS. 1, 2, 6 and 7, the reinforcement layers R1 and R2 are provided at the other main surface (lower-side main surface) of the second substrate 32. FIGS. 6 and 7 illustrate the engageable part 28 and the reinforcement layer R1, but the engageable part 29 and the reinforcement layer R2 are also provided in the same manner. This applies to FIGS. 11, 12, 20 and 21, which will be described later.

The substrate 3 and main surface at which the reinforcement layers R1 and R2 are provided are not particularly limited. The reinforcement layers R1 and R2 are disposed at the frontward side of the engageable parts 28 and 29 with reference to the connecting direction I, which is the direction of connection with a connector, on the one main surface and/or the other main surface possessed by one or more substrates 3 among the substrates 3 which include the first substrate 31, second substrate 32, and third substrate or substrates 33.

FIG. 4A illustrates an example in which the reinforcement layer R1 (R2) is provided on the layer on which the first wirings 9 and second wirings 11 are provided. The first wirings 9 and second wirings 11 are connected, respectively, to the pads 15a and 17a through the vias 24 and 25. The reinforcement layer R1 (R2), however, may be formed separately from wirings on the main surface of the other substrate 34 on which the pads 15a and 17a, the first wirings 9 and the second wirings 11 are not formed. The wirings formed on the other substrate 34 are not electrically connected to the pads 15a and 17a.

FIG. 4B illustrates an example of the printed wiring board 1 which is in a different form from that of the printed wiring board 1 illustrated in FIG. 4A. The printed wiring board 1 illustrated in FIG. 4B comprises three conductive layers.

In the printed wiring board 1 illustrated in FIG. 4B, pads 15a are disposed as the front array of the uppermost layer, and at the rear array side, pads 17a and wirings 11 connected to the pads 17a are disposed. At the front array side of the second layer below the uppermost layer, expanded-width parts 9a and first wirings 9 merging into the expanded-width parts 9a are provided, and at the rear array side, only the expanded-width parts 11a are provided. In the lowermost layer which is the third layer below the second layer, first wirings 9' and expanded-width parts 9a' are formed at the front array side, and second wirings 11' and expanded-width parts 11a' are formed at the rear array side. In the vicinity of one or both of the expanded-width parts 9a' and 11a' at the edge side of the lowermost layer, a reinforcement layer R1 is provided separately therefrom. In the printed wiring board 1 of the multilayer structure, the pads 15a as the front array of the uppermost layer are electrically connected through vias 24 to the expanded-width parts 9a of the first wirings 9 as the front array of the second layer. The first wirings 9' and expanded-width parts 9a' at the front array side of the lowermost layer and the second wirings 11' and expanded-width parts 11a' at the rear array side of the lowermost layer are not electrically connected to the pads 15a and pads 17a of the uppermost layer and the expanded-width parts 9a and expanded-width parts 11a of the second layer. The thickness of the printed wiring board 1 can be maintained uniform by providing the expanded-width parts 9a' as the front array of the lowermost layer at locations corresponding to those of the pads 15a and providing the expanded-width parts 11a' as the rear array of the lowermost layer at locations corresponding to those of the pads 17a of the uppermost layer.

In FIG. 4B, an example is described in which the reinforcement layers R1 and R2 are formed separately from the wirings of the other substrate 34, but the reinforcement layers R1 and R2 may also be formed integrally with some of the wirings formed on the other substrate 34. In this case, the engaging strength can be enhanced because the area of the reinforcement layers R1 and R2 increases.

Thus, the reinforcement layers R1 and R2 are provided on the one main surface or the other main surface of the other substrate 34 provided with wirings that are not electrically connected to the pads 15a and 17a, and it is thereby possible to enhance the effect of the reinforcement layers R1 and R2 which are provided separately from the pads 15a and 17a, first wirings 9 and second wirings 11. In other words, the reinforcement layers R1 and R2 are provided on the main surface of the other substrate 34 which is not formed with the pads 15a and 17a, first wirings 9 and second wirings 11 to be electrically connected to a connector and are formed separately from the wirings, and the possibility of short-circuiting can thereby be more reduced. As a result, the disconnection resistance can be enhanced while reducing the risk of short-circuiting.

In the printed wiring board 1 of the present embodiment, the strength at the frontward side of the engageable parts 28 and 29, to which the force in the disconnecting direction is applied, can be enhanced because the engageable parts 28 and 29 are provided at the end edges of the connection end portion 13 so as to be engaged with a connector in the disconnecting direction and the reinforcement layers R1 and R2 are provided at the frontward side of the engageable parts 28 and 29 with reference to the connecting direction I which is the direction of connection with the connector. By providing the engageable parts 28 and 29 at the right and left end edges of the connection end portion 13, the right and left engageable parts 28 and 29 can receive the force in the disconnecting direction and the engagement with the connector is therefore stabilized. This ensures sufficient engaging force with the connector (disconnection resistance) even when the printed wiring board 1 is reduced in the thickness and size.

The reinforcement layers R1 and R2 may be or may not be formed of the same material as that of the first wirings 9 and second wirings 11. The reinforcement layers R1 and R2 may be or may not be formed of the same material as that of the pads 15 and 17. Although not particularly limited, the reinforcement layers R1 and R2 can be formed of other materials, such as thermoset ink, ultraviolet curable ink, photosensitive ink, resin, and silver, solder and other metals, provided that certain strength is obtained. When the reinforcement layers R1 and R2 are formed of the same material as that of the first wirings 9 and second wirings 11, the strength of the printed wiring board 1 can be uniform. When the reinforcement layers R1 and R2 are formed of the same material as that of the first wirings 9 and second wirings 11, manufacturing steps for forming the reinforcement layers R1 and R2 can be simplified and the cost can thus be reduced.

The reinforcement layers R1 and R2 may be or may not be formed to have the same thickness as that of the first wirings 9 and second wirings 11. The reinforcement layers R1 and R2 may be or may not be formed to have the same thickness as that of the pads 15 and 17. Although not particularly limited, the reinforcement layers R1 and R2 can be formed thicker or thinner than the first wirings 9 and second wirings 11, provided that certain strength is obtained. The reinforcement layers R1 and R2 can be formed thicker or thinner than the pads 15 and 17.

In the present embodiment, the thickness of the reinforcement layers R1 and R2 is equal to the thickness of the first wirings 9 and second wirings 11 which are formed on the same main surface together with the reinforcement layers R1 and R2. This can enhance the disconnection resistance when the printed wiring board 1 is connected to a connector. In addition, the distance between substrates can be uniform and the thickness of the printed wiring board 1 can also be uniform.

The width (length along the width direction W) of the reinforcement layers R1 and R2 may preferably be 100% or more of the width of the engageable parts 28 and 29. This can ensure sufficient disconnection strength. The length (length along the connecting direction I) of the reinforcement layers R1 and R2 can be appropriately set in accordance with strength and material of the reinforcement layers R1 and R2 or the like.

The reinforcement layers R1 and R2 may be formed on any one of main surfaces of the first substrate 31, that is to say, on the one main surface or the other main surface of the first substrate 31 and may also be formed on both the main surfaces. The reinforcement layers R1 and R2 may be formed on any one of main surfaces of the second substrate 32, that is, on the one main surface or the other main surface of the second substrate 32 and may also be formed on both the main surfaces. The reinforcement layers R1 and R2 may be formed on any one of main surfaces of the third substrate 33, that is, on the one main surface or the other main surface of the third substrate 33 and may also be formed on both the main surfaces. The reinforcement layers R1 and R2 may be or may not be formed on the same substrate 3 together with the pads 15 and 17. The reinforcement layers R1 and R2 may be or may not be formed on the same main surface together with the pads 15 and 17. The reinforcement layers R1 and R2 may be or may not be formed on the same substrate 3 together with the first wirings 9. The reinforcement layers R1 and R2 may be or may not be formed on the same main surface together with the second wirings 11. The reinforcement layers R1 and R2 can be formed on a plurality of substrates 3. The reinforcement layers R1 and R2 can be formed on a plurality of main surfaces. The reinforcement layers R1 and R2 in the present embodiment can be formed on one or more main surfaces among main surfaces that are formed with the first wirings 9 and/or the second wirings 11. The reinforcement layers R1 and R2 in the present embodiment can be formed on one or more main surfaces among main surfaces that are formed with the pads 15 and 17.

The reinforcement layers R1 and R2 in the present embodiment can be formed on the main surface which is formed with the first wirings 9 and second wirings 11. When the first wirings 9 and the second wirings 11 are formed on a plurality of main surfaces, the reinforcement layers R1 and R2 can be formed on one or more main surfaces among the main surfaces which are formed with the first wirings 9 and second wirings 11. The reinforcement layers R1 and R2 in the present embodiment can be formed on the main surface which is not formed with the first wirings 9 and second wirings 11. The degree of freedom in arrangement of the reinforcement layers R1 and R2 is ensured.

The reinforcement layers R1 and R2 in the present embodiment can be formed separately from the first wirings 9 and second wirings 11.

When the reinforcement layers R1 and R2 are independently formed, the shape of the reinforcement layers R1 and R2 is not particularly limited. As illustrated in FIGS. 1 and 2, the shape of the reinforcement layers R1 and R2 may be a rectangular shape. As illustrated in FIG. 7A, the shape of the reinforcement layers R1 and R2 may be an elliptical or circular shape. As illustrated in FIG. 7B, the shape of the reinforcement layers R1 and R2 may be a shape that is along the outer edges of the engageable parts 28 and 29. As illustrated in FIG. 7C, the shape of the reinforcement layers R1 and R2 may be a shape that is along the inner edges of the engageable parts 28 and 29 which are formed as through-holes. As illustrated in FIG. 7A, edge parts of the reinforcement layers R1 and R2 may preferably have a shape that is not in contact with the outer edge of the printed wiring board 1 (the same applies to the form of FIGS. 1, 2, and 6). In the case of a structure in which end parts of the reinforcement layers R1 and R2 are in contact with the outer edge of the printed wiring board 1, when a punching process is performed using a metal die at the time of manufacturing the printed wiring board 1, the metal die directly shears the reinforcement layers R1 and R2. When the reinforcement layers R1 and R2 are composed of metal such as copper foil, the metal die is readily worn away or damaged when shearing the reinforcement layers R1 and R2. The reinforcement layers R1 and R2 are disposed so as not to expose the end parts and the metal die can thereby be suppressed from being worn away and damaged. This can result in a reduced cost.

In general, some terminals of a connector are connected to a ground contact. If the reinforcement layers R1 and R2 are formed integrally with some of the first wirings 9 and second wirings 11 and made to have a shape that surrounds the engageable parts 28 and 29 as in the form illustrated in FIGS. 7B and 7C, the first wirings 9 and second wirings 11 for signals short-circuit with the ground through the reinforcement layers R1 and R2 and a connector of another electronic component. The reinforcement layers R1 and R2 in the present embodiment are formed separately from the first wirings 9 and second wirings 11 and are not electrically connected to the first wirings 9 and second wirings 11. This can prevent the pads 15a and 17a for signals from short-circuiting with the ground via the reinforcement layers R1 and R2 and engagement parts of the connector of another electronic component.

The reinforcement layers R1 and R2 in the present embodiment can be formed integrally with some of the first wirings 9 and second wirings 11.

Figure 9:
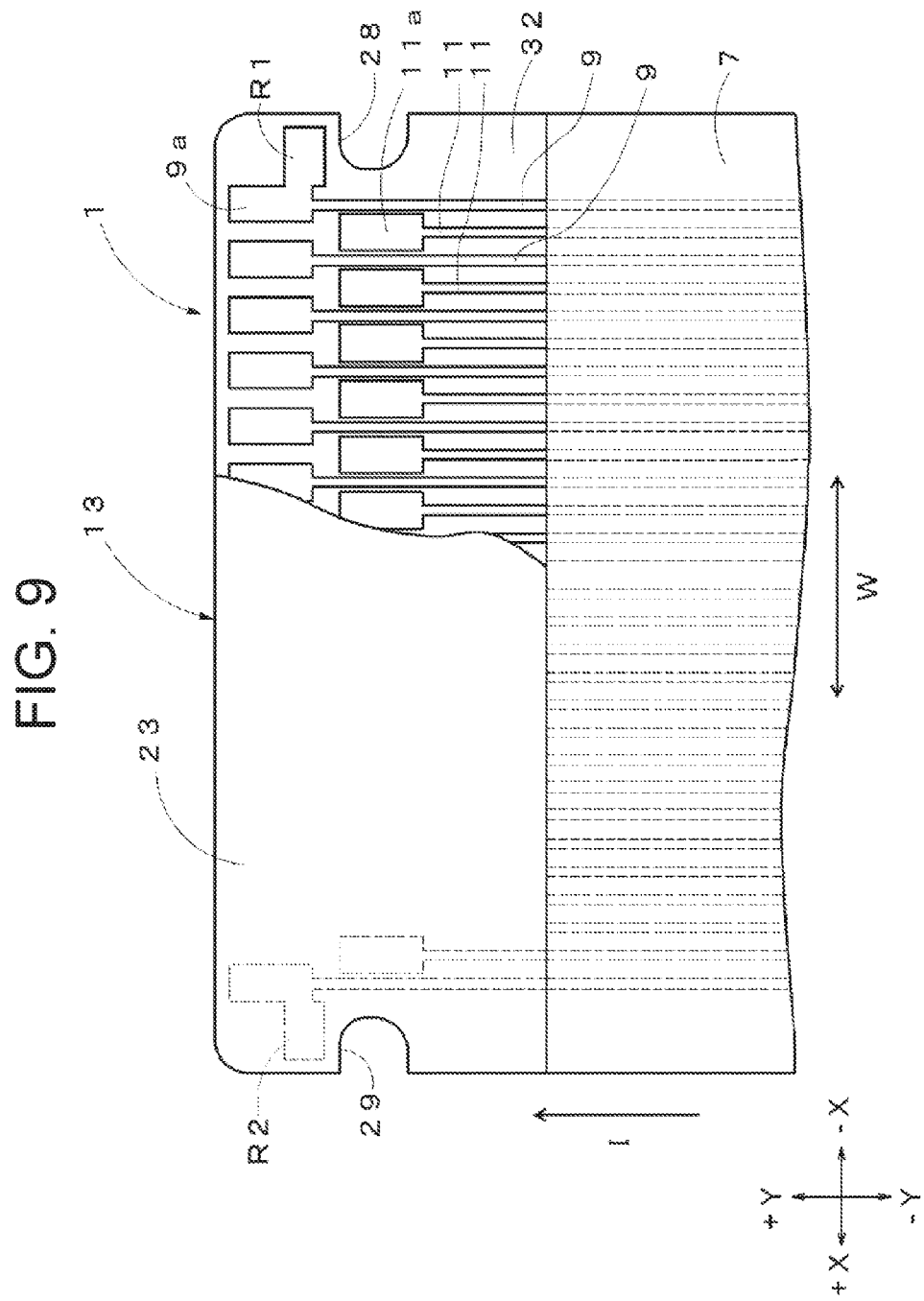
FIG. 9 is a bottom plan view of the printed wiring board illustrated in FIG. 8.
Figure 10A:
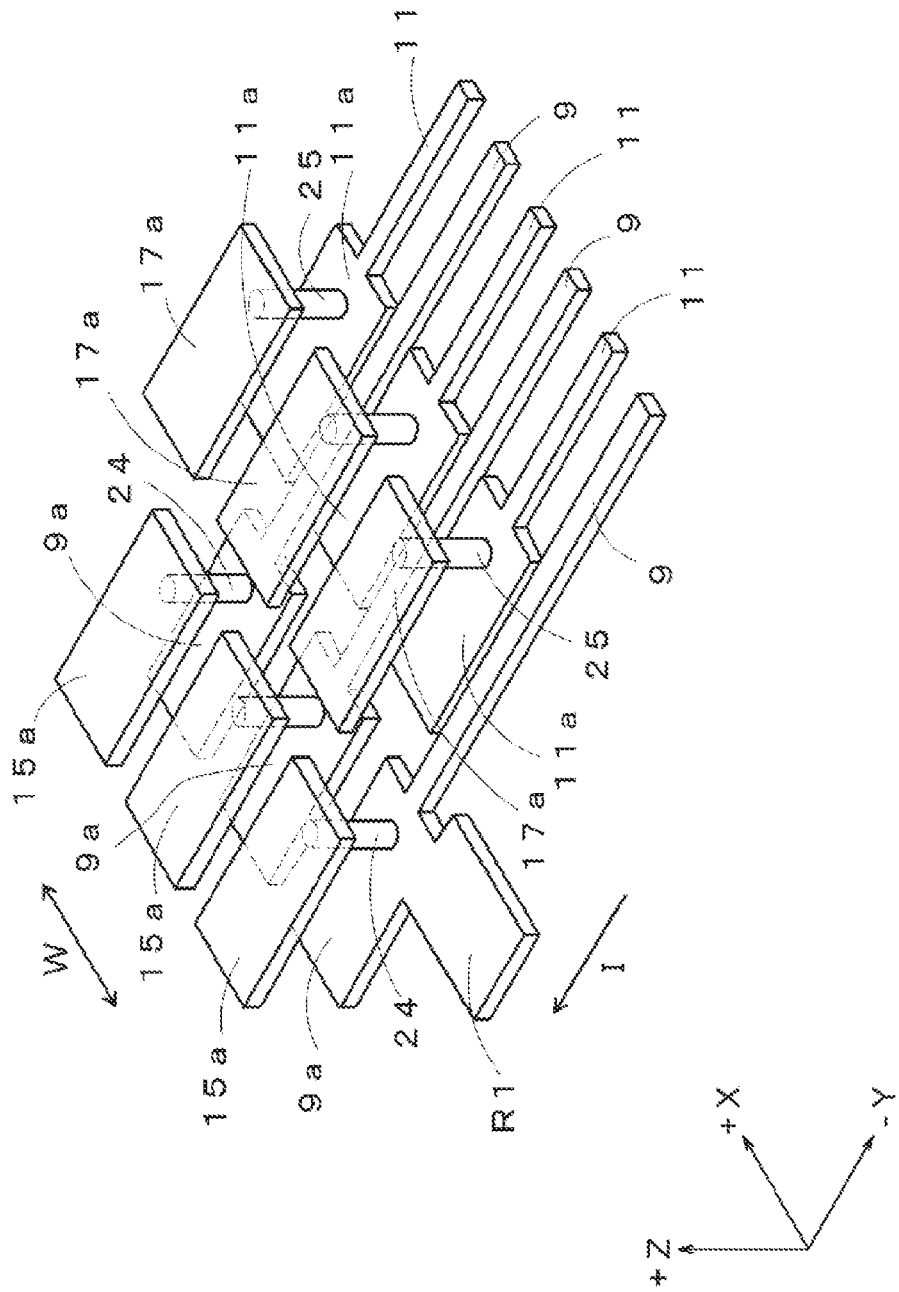
FIG. 10A is a perspective view schematically illustrating a relationship among wirings, a reinforcement layer and pads provided on one substrate among a plurality of substrates of the printed wiring board of FIG. 8.

FIG. 8 illustrates a plan view when the reinforcement layers R1 and R2 are formed integrally with some of the first wirings 9 and second wirings 11, FIG. 9 illustrates a bottom plan view, and FIG. 10A illustrates the relationship between the first wirings 9 and second wirings 11 and the reinforcement layers R1 and R2. FIG. 10B illustrates an example that is provided with three conductive layers. FIG. 8 corresponds to FIG. 1, FIG. 9 corresponds to FIG. 2, and FIGS. 10A and 10B correspond to FIGS. 4A and 4B. An example is described herein in which the reinforcement layers R1 and R2 are provided on the other main surface of the second substrate 32, but the main surface on which the reinforcement layers R1 and R2 are provided and the number of main surfaces are not limited.

FIG. 10A illustrates an example of two layers that are provided with the first wirings 9 and second wirings 11 connected to the pads 15a and 17a through the vias 24 and 25, but three layers may also be employed. FIG. 10B illustrates such an example of three layers.

The printed wiring board 1 of the example illustrated in FIG. 10B has contacts with a connector on both surfaces. This will be more specifically described. Pads 15a and 17a are provided in the uppermost layer. In the second layer below the uppermost layer, first wirings 9 and expanded-width parts 9a, second wirings 11 and expanded-width parts 11a, and reinforcement layers R1 and R2 are provided, and in the lowermost layer which is the third layer below the second layer, pads 15a' and 17a' are provided. In the printed wiring board 1 of the multilayer structure illustrated in FIG. 10B, the pads 15a as the front array of the uppermost layer are electrically connected through vias 24 to the expanded-width parts 9a of the first wirings 9 as the front array of the second layer. The pads 17a' as the rear array of the lowermost layer are electrically connected through vias 25' to the expanded-width parts 11a of the second wirings 11 as the rear array of the second layer. The pads 15a' as the front array of the lowermost layer are not connected to the other pads 15, first wirings 9, and second wirings 11. The thickness of the printed wiring board 1 can be maintained uniform by providing the pads 15a' as the front array of the lowermost layer at locations corresponding to those of the expanded-width parts 9a. Similarly, the thickness of the printed wiring board 1 can be maintained uniform by providing the pads 17a as the rear array of the uppermost layer at locations corresponding to those of the pads 17a' and expanded-width parts 11a. In FIG. 10B, the pads 17a as the rear array of the uppermost layer to which the vias 24 and 25 are not connected are formed to maintain the thickness of the printed wiring board 1 to be constant, as with the pads 15a' as the front array of the lowermost layer to which the vias 24 and 25 are not connected. In an alternative embodiment, these pads 15a' and 17a' to which the vias 24 and 25 are not connected may not be provided.

Thus, the reinforcement layers R1 and R2 are provided on the main surface of an inner layer of the multilayer structure, and it is thereby possible to enhance the effect of the reinforcement layers R1 and R2 which are provided integrally with some of the pads 15a and 17a, first wirings 9 and second wirings 11. In other words, the risk of short-circuiting can be relatively reduced than when the reinforcement layers R1 and R2 are formed in the uppermost layer or in the lowermost layer. Moreover, the reinforcement layers R1 and R2 are formed integrally with some of the first wirings 9 and second wirings 11 and can thereby be configured to have a large area. As a result, the disconnection resistance of the printed wiring board 1 can be enhanced.

When the reinforcement layers R1 and R2 merging into the first wirings 9 and second wirings 11 are formed, the shape of the reinforcement layers R1 and R2 is not particularly limited. As illustrated in FIGS. 8 to 11, the shape of the reinforcement layers R1 and R2 may be a rectangular shape. The shape of the reinforcement layers R1 and R2 may be a shape that has a curve as a part as illustrated in FIGS. 12A, 12B and 12C, may be a shape that is along the outer edges of the engageable parts 28 and 29 as illustrated in FIG. 12B, or may be a shape that surrounds the engageable parts 28 and 29 as illustrated in FIG. 12C. As in the examples illustrated in FIGS. 11 and 12A, edge parts of the reinforcement layers R1 and R2 may preferably have a shape that is not in contact with the outer edge of the printed wiring board 1. The reinforcement layers R1 and R2 are formed in this manner and a metal die can thereby be prevented from being worn away and damaged, as described above.

The reinforcement layers R1 and R2 are formed integrally with some of the first wirings 9 and second wirings 11 and can thereby have a large area. In this structure, the reinforcement layers R1 and R2 are supported by the first wirings 9 and second wirings 11 and high disconnection resistance can therefore be realized, compared with the case in which the reinforcement layers R1 and R2 are formed separately from the first wirings 9 and second wirings 11.

Although not particularly limited, the reinforcement layers R1 and R2 may be provided on a surface that is not formed with pads 15 and 17. Through this structure, even when a connector of another electronic component is grounded, the pads 15a and 17a for signals can be prevented from short-circuiting with the ground via the reinforcement layers R1 and R2 and engagement parts of the connector of another electronic component because the reinforcement layers R1 and R2 are not in direct contact with the connector.

The reinforcement layers R1 and R2 in the present embodiment can be formed on a main surface that is provided with the pads 15 and 17. When the pads 15 and 17 are provided on a plurality of main surfaces, the reinforcement layers R1 and R2 can be formed on one or more main surfaces among the main surfaces which are formed with the pads 15 and 17. The degree of freedom in arrangement of the reinforcement layers R1 and R2 is ensured.

FIG. 13 is a view illustrating a form in which an upper surface side coverlay 5 is provided at the uppermost surface of the printed wiring board of FIG. 8. The upper surface side coverlay 5 has extending parts 5a' and 5b' at its left-side and right-side end portions, respectively. The extending parts 5a' and 5b' extend toward the connection end portion 13 side along the connecting direction I. The extending parts 5a' and 5b' of the upper surface side coverlay 5 cover regions that correspond to the reinforcement layers R1 and R2 which are formed integrally with some of the wirings 9a and 11a disposed on the lower layer of the pads 15a and 17a. As illustrated in the figure, the upper surface side coverlay 5 does not cover a certain region on which the pads 15a and 17a are disposed. Thus, provision of the upper surface side coverlay 5 having the extending parts 5a' and 5b' which cover the surfaces of the reinforcement layers R1 and R2 and provision of the lower surface side coverlay 7 can improve resistance properties against the force in the disconnecting direction of the printed wiring board 1. The same applies to a case in which the reinforcement layers R1 and R2 are formed integrally with or separately from the pads 15a and 17a.

Next, the relationship between the reinforcement layers R1 and R2 and the pads 15 and 17 will be described.

The reinforcement layers R1 and R2 in the present embodiment can be formed separately from the pads 15 and 17.

Figure 16:
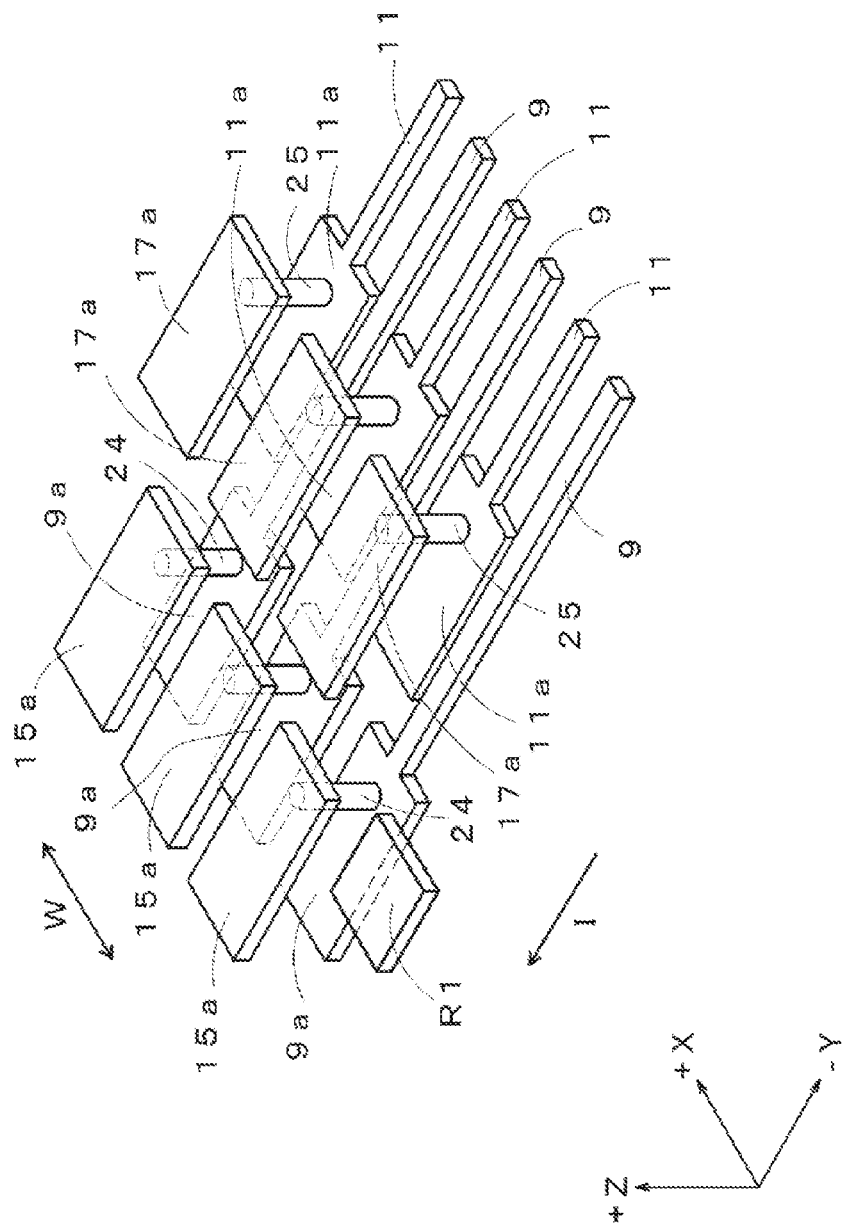
FIG. 16 is a perspective view schematically illustrating a relationship among pads, a reinforcement layer and wirings provided on one substrate among a plurality of substrates of the printed wiring board of FIG. 14.

FIG. 14 illustrates a plan view when the reinforcement layers R1 and R2 are formed separately from the pads 15 and 17, FIG. 15 illustrates a bottom plan view, and FIG. 16 illustrates the relationship between the pads 15 and 17 and the reinforcement layers R1 and R2. FIG. 14 corresponds to FIG. 1, FIG. 15 corresponds to FIG. 2, and FIG. 16 corresponds to FIG. 4A. An example is described herein in which the reinforcement layers R1 and R2 are provided on the one main surface of the first substrate 31, but the main surface on which the reinforcement layers R1 and R2 are provided and the number of main surfaces are not limited.

As illustrated in FIG. 14, the reinforcement layers R1 and R2 are separate from the pads 15 and 17 and therefore are not electrically connected to the pads 15 and 17.

When the reinforcement layers R1 and R2 are formed separately from the pads 15 and 17, the shape of the reinforcement layers R1 and R2 is not particularly limited. As illustrated in FIG. 14, the shape of the reinforcement layers R1 and R2 may be a rectangular shape. Although not illustrated, the shape of the reinforcement layers R1 and R2 may also be an elliptical or circular shape. In view of suppressing a metal die from being worn away and damaged, edge parts of the reinforcement layers R1 and R2 may preferably have a shape that is not in contact with the outer edge of the printed wiring board 1. The relationship between the reinforcement layers R1 and R2 and the pads 15 and 17 in this example corresponds to a reversed version of FIG. 6 which illustrates the relationship between the expanded-width parts 9a and 11a of the wirings 9 and 11 and the reinforcement layer R1. The shape of the reinforcement layers R1 and R2 in this example can be made as the shape of the reinforcement layers R1 and R2 illustrated in FIGS. 7A, 7B and 7C. When FIGS. 6 and 7A to 7C are borrowed to describe this example, the top and bottom surfaces are reversed so that the expanded-width parts 9a of the wirings 9 illustrated in FIGS. 6 and 7A to 7C are replaced with the pads 15a and the expanded-width parts 11a of the wirings 11 illustrated in FIG. 6 are replaced with the pads 17a.

Since the reinforcement layers R1 and R2 are not electrically connected to the pads 15 and 17, the pads 15 and 17 for signals can be prevented from short-circuiting with the ground via the reinforcement layers R1 and R2 and the engagement parts of a connector.

The reinforcement layers R1 and R2 in the present embodiment can be formed integrally with some of the pads 15 and 17.

Figure 17:
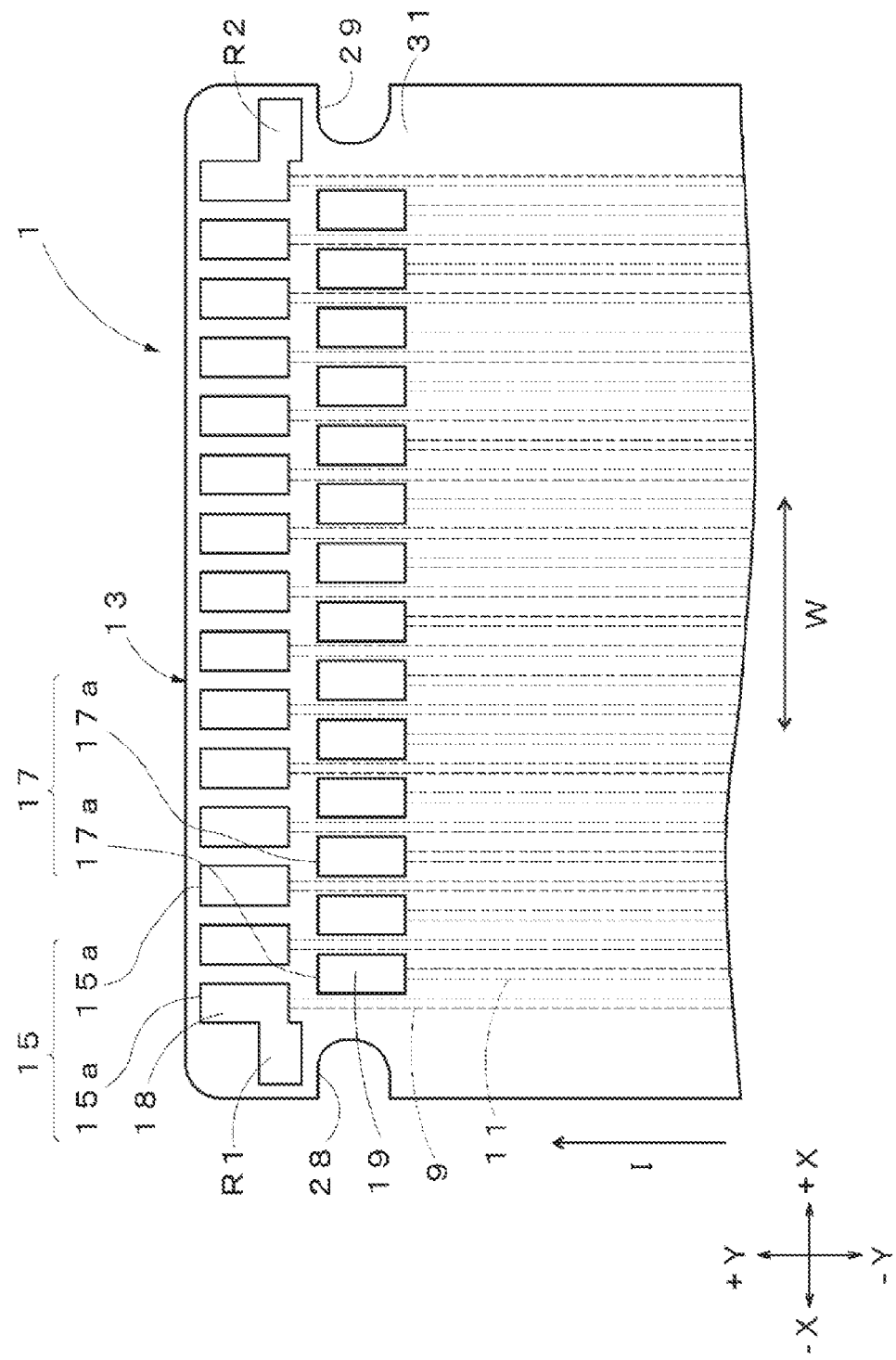
FIG. 17 is a plan view illustrating a part of a printed wiring board of a fourth example according to an embodiment of the present invention.
Figure 18:
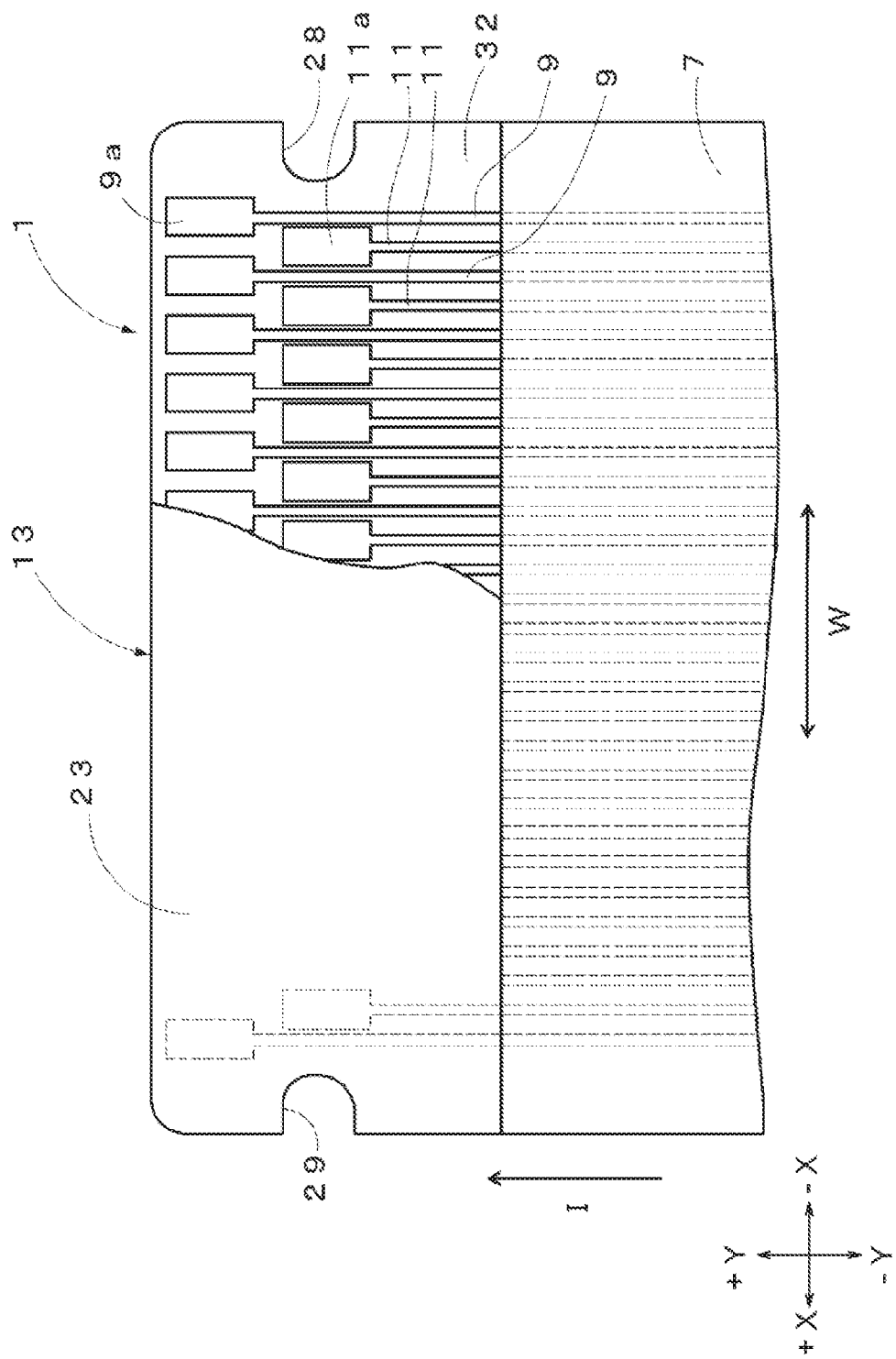
FIG. 18 is a bottom plan view of the printed wiring board illustrated in FIG. 17.
Figure 19:
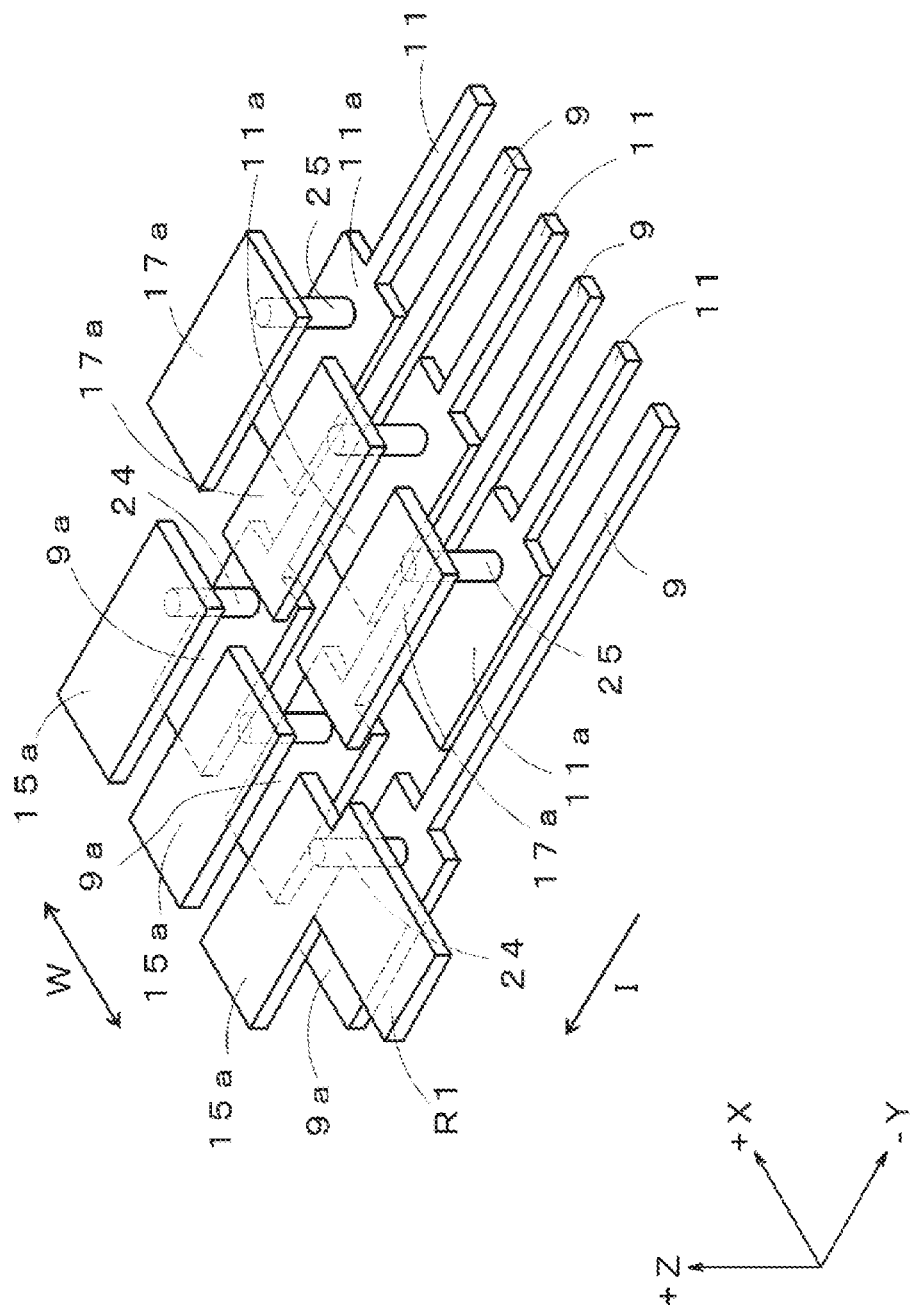
FIG. 19 is a perspective view schematically illustrating a relationship among pads, a reinforcement layer and wirings provided on one substrate among a plurality of substrates of the printed wiring board of FIG. 17.

FIG. 17 illustrates a plan of an example in which the reinforcement layers R1 and R2 are formed integrally with some of the pads 15 and 17, FIG. 18 illustrates a bottom plan view, and FIG. 19 illustrates the relationship between the pads 15 and 17 and the reinforcement layers R1 and R2. FIG. 17 corresponds to FIG. 1, FIG. 18 corresponds to FIG. 2, and FIG. 19 corresponds to FIG. 4A. An example is described herein in which the reinforcement layers R1 and R2 are provided on the one main surface of the first substrate 31, but the main surface on which the reinforcement layers R1 and R2 are provided and the number of main surfaces are not limited. FIG. 20 is a partial plan view illustrating a modified example of the engageable parts 28 and 29. FIGS. 21A to 21C are each a partial plan view illustrating a modified example of the reinforcement layers of the printed wiring board illustrated in FIG. 17.

When the reinforcement layers R1 and R2 merging into the pads 15 and 17 are formed, the shape of the reinforcement layers R1 and R2 is not particularly limited. As illustrated in FIGS. 17 to 20, the shape of the reinforcement layers R1 and R2 may be a rectangular shape. The shape of the reinforcement layers R1 and R2 may be a shape that has a curve as a part as illustrated in FIGS. 21A and 21B, may be a shape that is along the outer edges of the engageable parts 28 and 29 as illustrated in FIG. 21B, or may be a shape that surrounds the engageable parts 28 and 29 as illustrated in FIG. 21C. As in the examples illustrated in FIGS. 20 and 21A, edge parts of the reinforcement layers R1 and R2 may preferably have a shape that is not in contact with the outer edge of the printed wiring board 1. The reinforcement layers R1 and R2 are formed in this manner and a metal die can thereby be prevented from being in contact with the reinforcement layers R1 and R2 when forming the engageable parts 28 and 29. The metal die can thus be suppressed from being worn away and damaged.

The reinforcement layers R1 and R2 are formed integrally with some of the pads 15 and 17 and can thereby have a large area. In this structure, the reinforcement layers R1 and R2 are supported by the first wirings 9 and second wirings 11 and high disconnection resistance can therefore be realized, compared with the case in which the reinforcement layers R1 and R2 are formed separately from the pads 15 and 17.

Then, a method of manufacturing the printed wiring board 1 of the present embodiment will be described.

The method of manufacturing the printed wiring board 1 of the present embodiment is not particularly limited, and a scheme of producing a multilayer-type printed wiring board known in the art at the time of filing of the present application can be appropriately used.

First, a plurality of substrates is prepared. In each of the substrates, conductive layers are formed on both main surfaces of an insulating substrate. In the present embodiment, double-sided copper clad laminates are prepared in which copper foil layers are formed on both main surfaces of a polyimide substrate. The double-sided copper clad laminates may be, but are not limited to, those configured such that copper is deposited or sputtered on the polyimide substrates and copper plating is then performed. The double-sided copper clad laminates may also be those obtained by attaching copper foil layers to the polyimide substrates via adhesive.

Then, via holes are formed to pass through each of the double-sided copper clad laminates at predetermined positions of the double-sided copper clad laminate, such as by laser machining and CNC drilling. The via holes pass through the double-sided copper clad laminate in the thickness direction. A process of DPP (Direct Plating Process) is performed to form conductive layers on the inner wall surfaces of the via holes and a copper plated layer is then formed on the whole surface of the double-sided copper clad laminate including the inner wall surfaces of the via holes. As will be understood, a partial plating process may be performed to include the via holes. Through this operation, vias 24 and 25 are formed to electrically connect the one main surface and the other main surface of the double-sided copper clad laminate. Desired pads 15 and 15, first wirings 9 and second wirings 11 are formed on the one main surface and the other main surface of the double-sided copper clad laminate using a common photolithography technique. In accordance with the function required for the printed wiring board 1, the pads 15 and 17 and/or the first wirings 9 and second wirings 11 are formed on each substrate 3 (double-sided copper clad laminate) and on each main surface of the substrate 3 (double-sided copper clad laminate).

During this operation, the reinforcement layers R1 and R2 of a desired shape are formed at desired locations together with the first wirings 9 and second wirings 11. In the present embodiment, a mask pattern is produced on a main surface of the double-sided copper clad laminate in accordance with patterns of the first wirings 9, second wirings 11 and the reinforcement layers R1 and R2 and the copper foil layer is etched to obtain the first wirings 9, second wirings 11 and the reinforcement layers R1 and R2. When the reinforcement layers R1 and R2 are formed integrally with some of the first wirings 9 and second wirings 11, a mask pattern in which they are in an integral form is produced and the copper foil layer is etched to obtain the substrate 3 in which the reinforcement layers R1 and R2 are formed integrally with some of the first wirings 9 and second wirings 11. When the reinforcement layers R1 and R2 are formed separately from the first wirings 9 and second wirings 11, a mask pattern in which they are in a separate form is produced and the copper foil layer is etched to obtain the substrate 3 in which the reinforcement layers R1 and R2 are formed separately from the first wirings 9 and second wirings.

Similarly, the reinforcement layers R1 and R2 of a desired shape may be formed at desired locations together with the pads 15 and 17. In the present embodiment, a mask pattern is produced on a main surface of the double-sided copper clad laminate in accordance with patterns of the pads 15 and 17 and the reinforcement layers R1 and R2 and the copper foil layer is etched to obtain the pads 15 and 17 and the reinforcement layers R1 and R2. When the reinforcement layers R1 and R2 are formed integrally with some of the pads 15 and 17, a mask pattern in which they are in an integral form is produced and the copper foil layer is etched to obtain the substrate 3 in which the reinforcement layers R1 and R2 are formed integrally with some of the pads 15 and 17. When the reinforcement layers R1 and R2 are formed separately from the pads 15 and 17, a mask pattern in which they are in a separate form is produced and the copper foil layer is etched to obtain the substrate 3 in which the reinforcement layers R1 and R2 are formed separately from the pads 15 and 17.

The obtained plurality of substrates is stacked together using an adhesive. Curing treatment for the adhesive is performed as necessary.

The upper surface side coverlay 5 is attached to the uppermost surface of the laminated substrates 3 using an adhesive and the lower surface side coverlay 7 is attached to the lowermost surface using an adhesive. Surface treatment such as gold plating is performed for the surfaces of the pads 15 and 17 to form surface-treated layers.

A metal die is preliminarily prepared and used to cut off predetermined regions of the substrates 3 to form the engageable parts 28 and 29. Through this operation, the printed wiring board 1 of the present embodiment is obtained.

Although not particularly limited, as illustrated in FIGS. 22A and 22B and FIGS. 23A and 23B, the printed wiring board 1 of the present embodiment may be configured to have an electromagnetic wave shield layer. FIGS. 22A and 22B and FIGS. 23A and 23B illustrate the form of a shield layer 40, 40'. For descriptive purposes, FIGS. 22A and 22B and FIGS. 23A and 23B illustrate only the first substrate 31 which is provided with the shield layer 40, 40', and the third substrate 33 which is laminated as a lower layer on the first substrate 31. Practically, one or more other third substrates 33 and the second substrate 32 are laminated as lower layers on the third substrate 33.

Figure 22A:
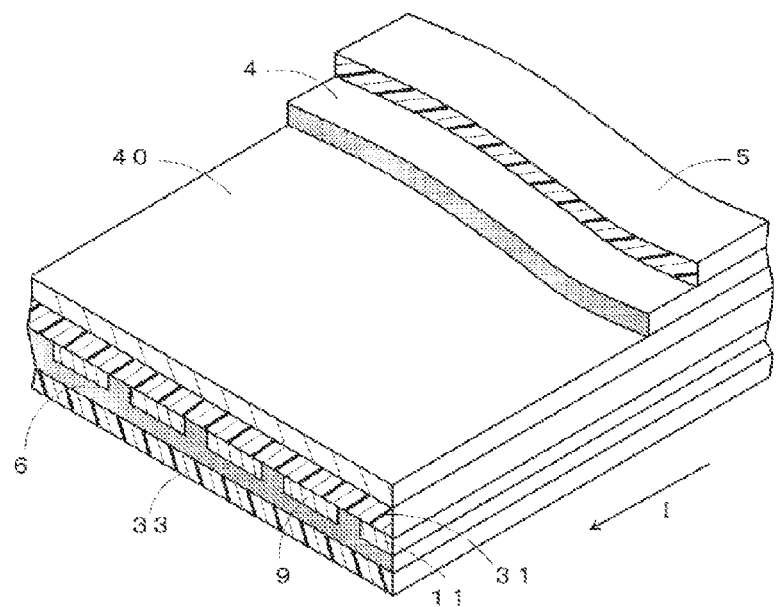
FIGS. 22A and 22B are partial perspective views each illustrating a printed wiring board having a ground layer according to an embodiment of the present invention.
Figure 22B:
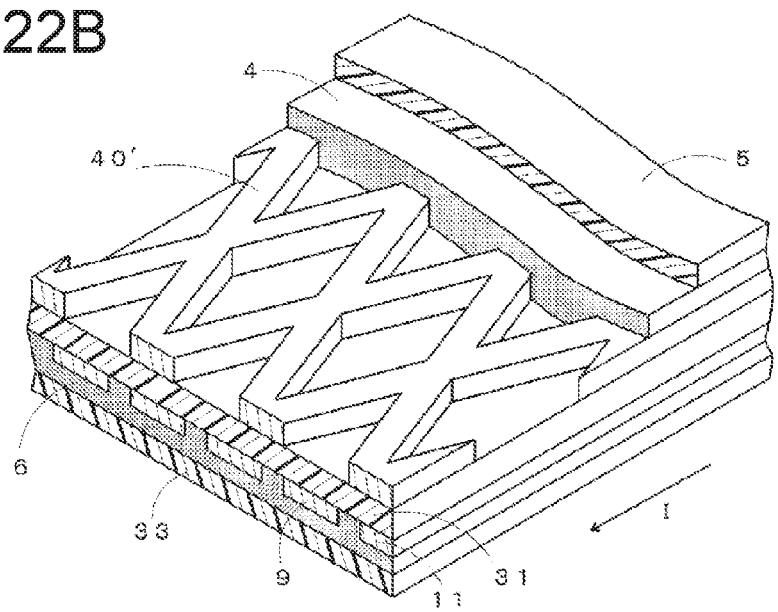

As illustrated in FIGS. 22A and 22B, the first wirings 9 and second wirings 11 are formed at the other main surface side of the first substrate 31 and the shield layer 40, 40' is formed at the one main surface side opposite to the other main surface side. The shield layer 40, 40' is connected to a ground contact. As illustrated in FIG. 22A, the pattern of the shield layer 40 can be a solid pattern without cutout. In view of imparting flexibility and reducing the weight, a pattern of a reduced amount of metal may be employed by cutting off a part or parts thereof, provided that the electromagnetic wave shield performance can be ensured. As an example, a grid-like mesh pattern may be employed, such as the shield layer 40' illustrated in FIG. 22B.

Figure 23A:
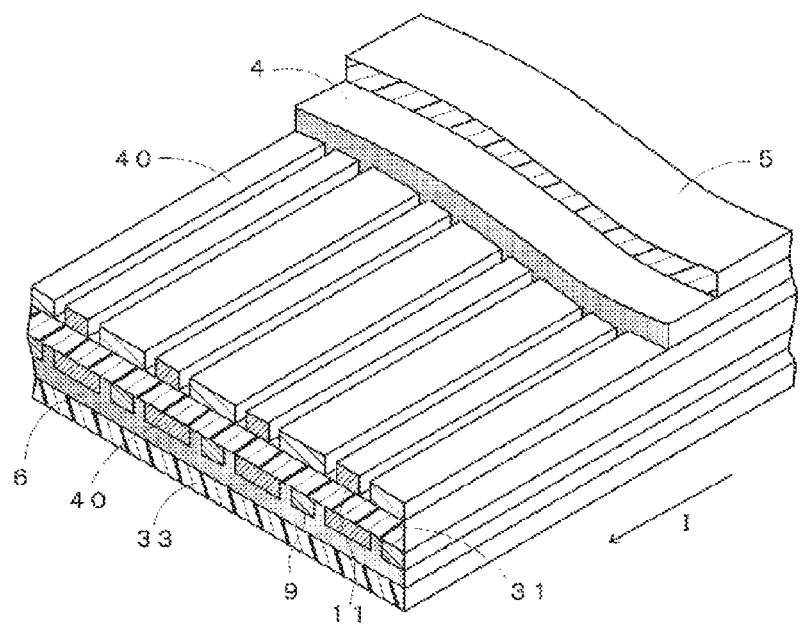
FIGS. 23A and 23B are partial perspective views each illustrating another printed wiring board having a ground layer according to an embodiment of the present invention.
Figure 23B:
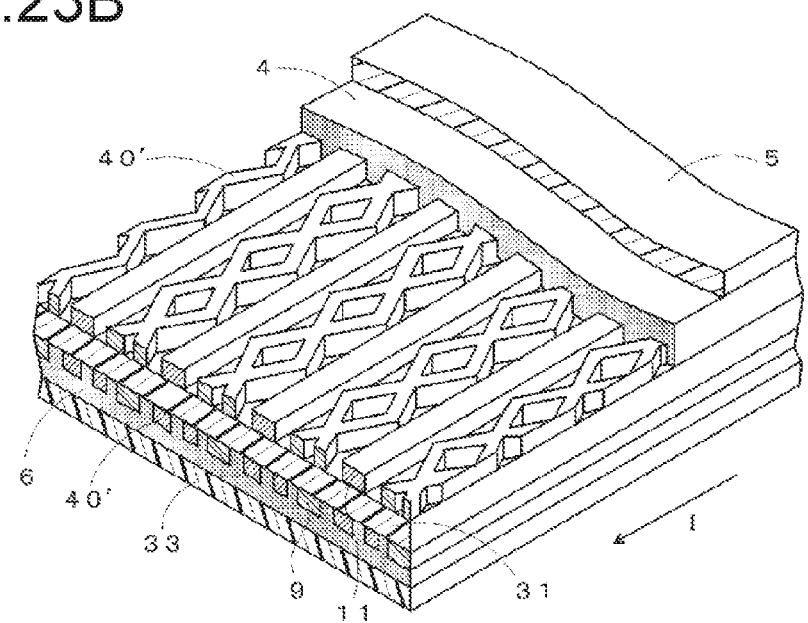

As illustrated in FIGS. 23A and 23B, the first wirings 9 and second wirings 11 are formed at the one main surface side of the first substrate 31 and the shield layer 40, 40' may be formed also at the one main surface side between the first wirings 9 and the second wirings 11. The pattern of the shield layer 40, 40' is not particularly limited and may be a solid patter without cutout as illustrated in FIG. 23A or may also be a mesh pattern with cutouts as illustrated in FIG. 23B.

The shield layer 40, 40' can be produced together with the pads 15 and 17, first wirings 9, second wirings 11 and reinforcement layers R1 and R2 using a photolithography method.

Finally, with reference to FIGS. 24 to 29, a connector 50 to which the printed wiring board 1 of the present embodiment is connected will be described.

Figure 24:
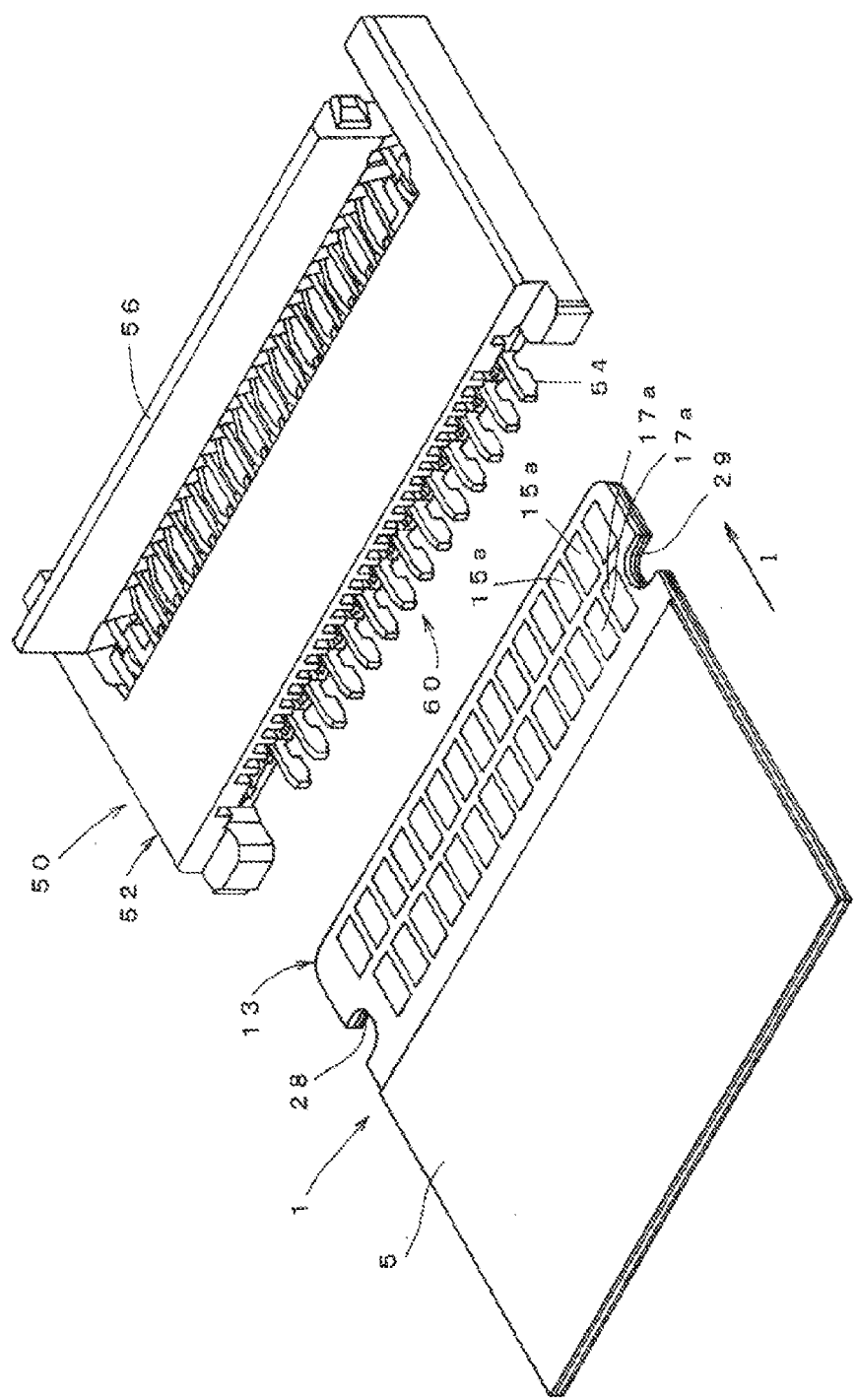
FIG. 24 is a perspective view illustrating a form of a printed wiring board and a connector to be connected to the printed wiring board according to an embodiment of the present invention.

As illustrated in FIG. 24, the connector 50 comprises: a housing 52 into which the printed wiring board 1 is inserted; a plurality of contacts 54 that are to be electrically connected to the pads 15a and 17a of the printed wiring board 1; a rotative member 56 as an operative member that presses, via the contacts 54, the printed wiring board 1 inserted in the housing 52; and tab-like lock members 58 as engagement parts that engage with the engageable parts 28 and 29 provided at both side edge parts of the connection end portion 13 of the printed wiring board 1.

The housing 52 is made of electrically insulating plastic. The material of the housing 52 may be polybutylene terephthalate (PBT), polyamide (66PA, 46PA), liquid crystal polymer (LCP), polycarbonate (PC), polytetrafluoroethylene (PTFE), or a composite material thereof. The housing 52 has a required number of insertion channels in which the contacts 54 are inserted. The housing 52 has, at its rearward side, an insertion opening 60 into which the printed wiring board 1 is inserted.

Figure 25A:
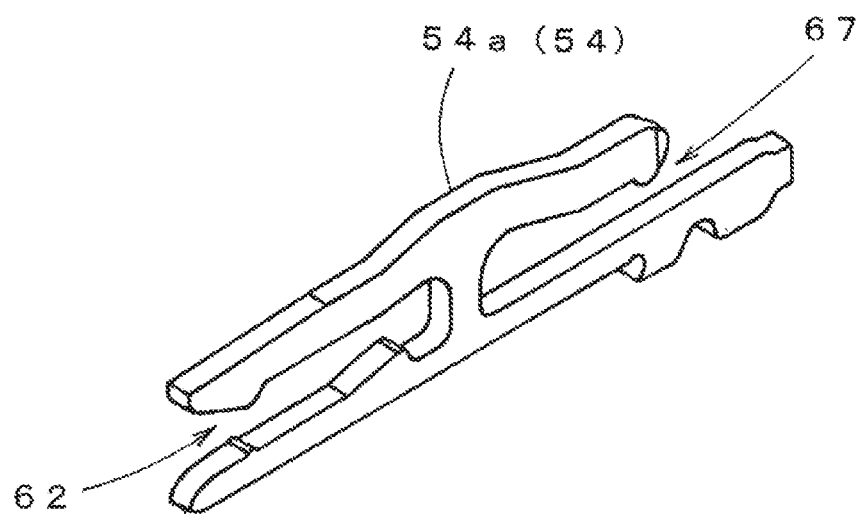
FIGS. 25A and 25B are perspective views illustrating two types of contacts of the connector.
Figure 25B:
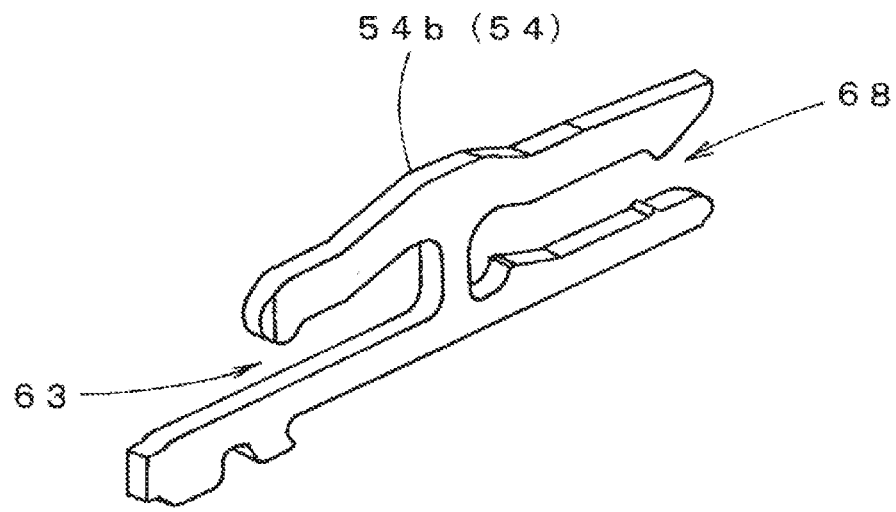

Each contact 54 has spring properties and conductivity. Although not particularly limited, the contacts 54 are formed using brass, beryllium copper, phosphor bronze, or the like. FIGS. 25A and 25B illustrate examples of the contacts 54. As illustrated in FIGS. 25A and 25B, the connector 50 has two types of contacts 54a and 54b for the pads 15a of the front array and the pads 17a of the rear array of the printed wiring board 1. These two types of contacts are set to be aligned with the pads 15a and 17a so that the insertion positions are different. These two types of contacts 54a and 54b have respective H-shaped figures that are formed with rearward side openings 62 and 63 into which the connection end portion 13 of the printed wiring board 1 is inserted and frontward side openings 67 and 68 into which a cam 65 of the rotative member 56 to be described later is inserted.

Likewise, the lock members 58 have H-shaped figures that are, as illustrated in FIG. 26, formed with rearward side openings 58a into which the connection end portion 13 of the printed wiring board 1 is inserted and frontward side openings 58b into which the cam 65 of the rotative member 56 to be described later is inserted. The lock members 58 are disposed at both sides of the set of contacts 54.

As illustrated in FIG. 27, the rotative member 56 is rotatably supported at its both ends by the housing 52 around a rotation axis in the width direction. The rotative member 56 has the cam 65 which is inserted, on the rotation axis, into the above-described frontward side openings 67 and 68 of the contacts 54 and into the frontward side openings 58b of the lock members 58. After the printed wiring board 1 is inserted in the insertion opening 60 of the housing 52, the rotative member 56 is rotated toward the direction of its lying. This operation causes the cam 65 to expand the frontward side openings 67 and 68 of the contacts 54 and the frontward side openings 58b of the lock members 58 against the spring force of the contacts 54 and lock members 58.

As illustrated in FIG. 26, the rearward side openings 62 and 63 of the contacts 54 and the rearward side openings 58a of the lock members 58 are narrowed, and the electric connection between the contacts 54 and the printed wiring board 1 and the engagement of the lock members 58 with the engageable parts 28 and 29 are achieved. In contrast, when the rotative member 56 is rotated toward the direction of its standing as illustrated in FIG. 27, the electric connection and the engagement of the lock members 58 are released.

Figure 28:
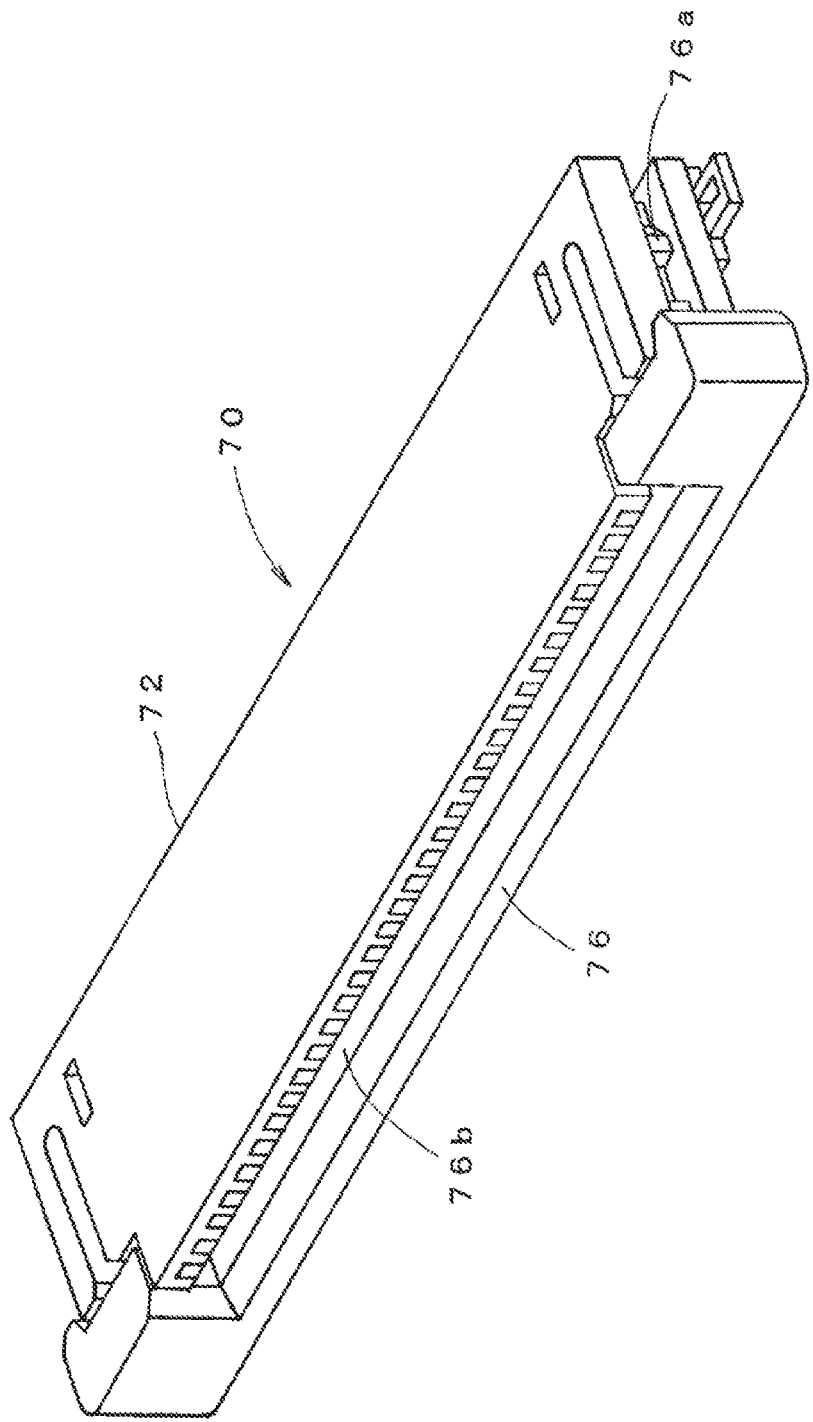
FIG. 28 is a perspective view illustrating another connector.
Figure 29A:
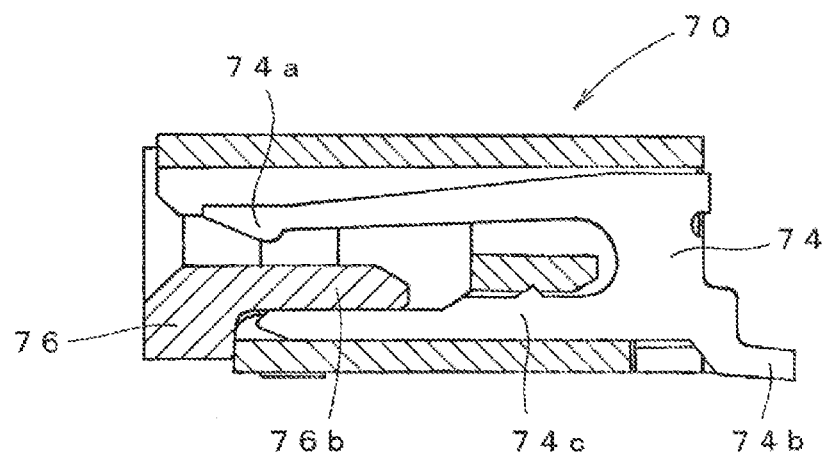
FIG. 29A is a cross-sectional view illustrating a state before the printed wiring board is inserted in a housing of the connector and FIG. 29B is a cross-sectional view illustrating a state in which the printed wiring board is inserted in the housing and pressed against the printed wiring board by a slider.
Figure 29B:
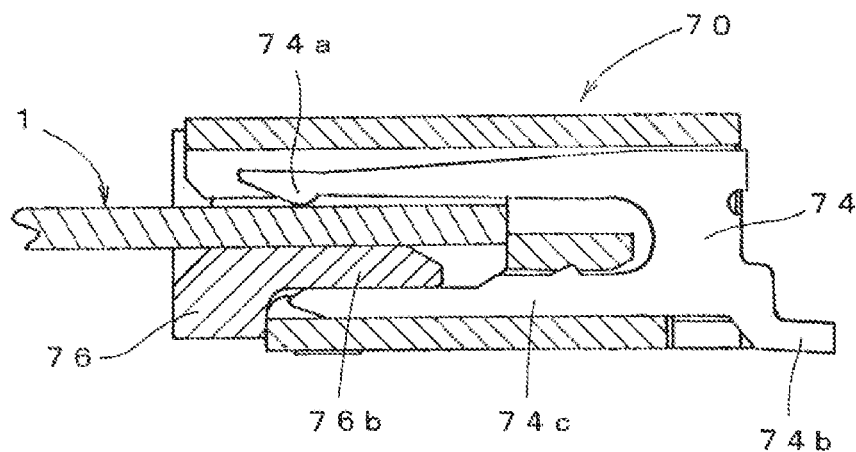

The operating member may be, other than the rotative member 56 as described above, a slider that is inserted into the housing to press the printed wiring board to the contacts after the printed wiring board is inserted in the housing. Specifically, a connector 70 as illustrated in FIG. 28 and FIGS. 29A and 29B may be configured to mainly comprise a housing 72, contacts 74, and a slider 76. The contacts 74 have U-shaped figures, as illustrated in FIGS. 29A and 29B, and are each mainly configured of a contacting part 74a that comes into contact with the printed wiring board 1, a connecting part 74b that is connected to the other substrate or the like, and a fixed part 74c that is fixed to the housing 72. These contacts 74 are fixed to the housing 72, such as by press fitting. The slider 76 has a U-shaped or V-shaped figure, as illustrated in FIGS. 29A and 29B. After the printed wiring board 1 is inserted in the housing 72 provided with a required number of the contacts 74, the slider 76 is inserted into the housing 72. Such a slider 76 mainly comprises mounted parts 76a that are mounted to the housing 72, and a pressing part 76b that presses the printed wiring board 1 against the contacting parts 74a of the contacts 74. Before the printed wiring board 1 is inserted, the slider 76 is in a state of being provisionally mounted to the housing 72. When the slider 76 is inserted after the printed wiring board 1 is inserted, the pressing part 76b of the slider 76 is inserted parallel to the printed wiring board 1, as illustrated in FIG. 29B, and the printed wiring board 1 becomes to be pressed against the contacting parts 74a of the contacts 74. Although not illustrated, like the connector 50 of the previous embodiment, the connector 70 of the present embodiment also has engagement parts that, when the slider 76 is inserted, engage with the engageable parts 28 and 29 provided with the printed wiring board 1.

EXAMPLES

Tests for confirming the effects of the present invention were performed, which will be described below.

Example 1

As Example 1, a printed wiring board 1 of a multilayer structure having the structure illustrated in FIGS. 1 to 4 was produced. The first substrate 31, second substrate 32, and third substrate 33 were produced through a scheme using a photolithography technique for the first wirings 9, second wirings 11, pads 15 and 17, and reinforcement layers R1 and R2.

Double-sided copper clad laminates were used as the first substrate 31, second substrate 32, and third substrate 33. Each double-sided copper clad laminate has a polyimide film of a thickness of 20 [μm] and copper foil layers formed on the polyimide film. The arrangement of the pads 15 and 17 is as illustrated in FIG. 1. Pitch of the pads 15 and 17 was 0.175 [mm] (0.35 [mm] in each array). The material of the pads 15 and 17, first wirings 9, second wirings 11, and reinforcement layers R1 and R2 was copper. The reinforcement layers R1 and R2 had a width of 0.5 [mm], length of 0.5 [mm], and thickness of 22.5 [μm] (copper: 12.5 [μm], copper plating: 10 [μm], the same thickness as that of the first wirings 9 and second wirings 11). Gold plated layers were formed as surface-treated layers on the upper surfaces of the pads 15 and 17. Polyimide films of a thickness of 12.5 [μm] were used as the upper surface side coverlay 5 and lower surface side coverlay 7. A polyimide film of a thickness of 12.5 [μm] was used as the reinforcement film 23. Predetermined regions of the laminated printed wiring board 1 were cut off using a metal die to provide the engageable parts 28 and 29. With regard to the size of these engageable parts 28 and 29 (notched parts), the width was 0.5 [mm] and the length was 0.5 [mm]. Conditions in production steps for the first substrate 31, second substrate 32, and third substrate 33 were common in Examples 1 to 5 and Comparative Example.

The printed wiring board 1 was produced under the above conditions in accordance with the following procedure.

(1) The first substrate 31 was prepared to have the connection end portion 13 formed with 15 sheets of the pads 15 as the front array and 14 sheets of the pads 17 as the rear array.

(2) The second substrate 32 was prepared to have the other main surface formed with both the first wirings 9 connected to the pads 15 as the front array and the second wirings 11 connected to the pads 17 as the rear array.

(3) The third substrate 33 was prepared to have the one main surface and the other main surface each formed with both the first wirings 9 connected to the pads 15 as the front array and the second wirings 11 connected to the pads 17 as the rear array.

(4) The second substrate 32, third substrate 33, and first substrate 31 were laminated in this order from the lower side.

In the printed wiring board 1 of Example 1, the reinforcement layers R1 and R2 were formed separately from the first wirings 9 and second wirings 11 at the other main surface side of the second substrate 32. The reinforcement layers R1 and R2 were provided at the frontward side of the engageable parts 28 and 29 with reference to the connecting direction I.

Example 2

As Example 2, the printed wiring board 1 was produced as in Example 1 except that the reinforcement layers R1 and R2 were formed integrally with some of the first wirings 9 and second wirings 11.

Example 3

As Example 3, the printed wiring board 1 was produced as in Example 1 except that the reinforcement layers R1 and R2 were formed on the one main surface of the first substrate 31 and formed separately from the pads 15 and 17.

Example 4

As Example 4, the printed wiring board 1 was produced as in Example 1 except that the reinforcement layers R1 and R2 were formed on the one main surface of the first substrate 31 and formed integrally with some of the pads 15 and 17.

Example 5

As Example 5, the printed wiring board 1 was produced as in Example 1 except that the upper surface side coverlay 5 (insulating layer) illustrated in FIG. 5 was provided at the uppermost surface of the printed wiring board 1.

Comparative Example 1

As Comparative Example 1, a printed wiring board was produced which was different from Example 1 only in the point that no reinforcement layers were provided.
(Test of Disconnection Resistance)

The test of disconnection resistance was performed through connecting each of the printed wiring boards of Examples 1 to 5 and Comparative Example 1 to a connector having the structure illustrated in FIG. 24 (but no contacts were provided) and obtaining a state in which the printed wiring board was simply fitted with and held by the tab-like lock members. In this state, the printed wiring board 1 was pulled from the connector in the disconnecting direction (opposite direction to the connecting direction I) using a tensile tester and the load of the tensile tester was measured when the printed wiring board 1 was disconnected from the connector.
(Test Results)

Results of the test are as follows. The assumption is that the load when the printed wiring board of Comparative Example 1 was disconnected from the connector is 100%. The load when the printed wiring board 1 of each of Examples 1 to 5 was disconnected from the connector is 140% to 170%. It has thus been confirmed that the printed wiring board 1 of the present embodiment can maintain the engagement state even when force in the disconnecting direction is applied.

INDUSTRIAL APPLICABILITY

According to the present invention, it is possible to provide a printed wiring board that can maintain the engagement state even when force in the disconnecting direction is applied.

DESCRIPTION OF REFERENCE NUMERALS

1 . . . Printed wiring board
3 . . . Substrate
   31 . . . First substrate
   32 . . . Second substrate
   33 . . . Third substrate
   34 . . . Other substrate
4 . . . Adhesive layer
5 . . . Upper surface side coverlay
5a, 5b . . . Insulating layer
6 . . . Adhesive layer
7 . . . Lower surface side coverlay
9 . . . First wirings
11 . . . Second wirings
13 . . . Connection end portion
15, 15a, 15a' . . . Pads of front array, First pads
17, 17a, 17a' . . . Pads of rear array, Second pads
18, 19 . . . Surface-treated layer
21 . . . Adhesive layer
23 . . . Reinforcement film 24, 25 . . . Via
28, 29 . . . Engageable part
R1, R2 . . . Reinforcement layer (First reinforcement layer)
40, 40' . . . Electromagnetic wave shield layer
41, 42 . . . Blind via hole
50 . . . Connector
52 . . . Housing
54 . . . Contact
56 . . . Rotative member (Operative member)
58 . . . Lock member (Engagement part)
65 . . . Cam
70 . . . Connector
72 . . . Housing
74 . . . Contact
76 . . . Slider

The invention claimed is:

1. A printed wiring board of a multilayer structure comprising:
- a plurality of substrates including at least a first substrate and a second substrate, the first substrate being formed with a plurality of pads to be electrically connected to a connector, the second substrate being laminated directly on or indirectly via a substrate other than the first substrate on any one of main surfaces of the first substrate, the second substrate being formed with wirings on any one of main surfaces;
- an engageable part formed at a connection end portion to be connected to the connector, the engageable part being to be engaged with an engagement part of the connector; and
- one or more reinforcement layers provided on one or more main surfaces possessed by the plurality of substrates, the one or more reinforcement layers being provided at locations at a frontward side than a location at which the engageable part is provided, with reference to a connecting direction when the printed wiring board is connected to the connector,
- the plurality of pads formed on the first substrate being disposed within the connection end portion at one main surface side of the first substrate, the plurality of pads formed on the first substrate being arranged to form a front array and a rear array in two rows when viewed in the connecting direction to the connector,
- the wirings formed on the second substrate including first wirings and second wirings, the first wirings being connected through vias penetrating the one or more substrates to first pads of the front array among the plurality of pads arranged to form the front array and the rear array in two rows, the second wirings being connected through vias penetrating the one or more substrates to second pads of the rear array among the plurality of pads arranged to form the front array and the rear array in two rows,
- the wirings each having a part formed to have a constant width along an inserting direction to the connector and an expanded-width part expanded to have a wider width than the constant width at a side of the connection end portion in the inserting direction to the connector, the expanded-width part being provided at a location corresponding to each of the pads,
- the expanded-width parts including first expanded-width parts having approximately same shape as that of the first pads and second expanded-width parts having approximately same shape as that of the second pads.

2. The printed wiring board according to claim 1, wherein the second substrate has wirings formed on other main surface opposite to the one main surface of the second substrate.

3. The printed wiring board according to claim 1, further comprising
one or more third substrates,
wherein each of the third substrates has wirings formed on one main surface and/or other main surface of the third substrate,
wherein the one or more reinforcement layers are provided on one main surface and/or other main surface of any one or more of substrates among the plurality of substrates, wherein the one or more reinforcement layers are provided at locations at the frontward side than the location at which the engageable part is provided, with reference to the connecting direction to the connector.

4. The printed wiring board according to claim 1, wherein the first substrate includes a substrate formed with the plurality of pads at one main surface side and a substrate formed with the plurality of pads at other main surface side opposite to the one main surface.

5. The printed wiring board according to claim 1, wherein the one or more reinforcement layers are provided on one or more main surfaces among main surfaces formed with the wirings.

6. The printed wiring board according to claim 5, wherein the one or more reinforcement layers are formed integrally with some of the wirings.

7. The printed wiring board according to claim 5, wherein the one or more reinforcement layers are formed separately from the wirings.

8. The printed wiring board according to claim 1, wherein the one or more reinforcement layers are provided on one or more main surfaces among main surfaces formed with the pads.

9. The printed wiring board according to claim 8, wherein the one or more reinforcement layers are formed integrally with some of the pads.

10. The printed wiring board according to claim 8, wherein the one or more reinforcement layers are formed separately from the pads.

11. The printed wiring board according to claim 1, further comprising
an insulating layer covering surfaces of the one or more reinforcement layers.

* * * * *